(12) United States Patent
Blank et al.

(10) Patent No.: US 6,427,349 B1
(45) Date of Patent: *Aug. 6, 2002

(54) COMPENSATION SYSTEM FOR ELECTRONIC COMPASS

(75) Inventors: Rodney K. Blank; Richard J. Gahan; Howard J. Haselhuhn, Jr., all of Holland; Kenneth L. Schierbeek, Zeeland; Kenneth Schofield, Holland, all of MI (US)

(73) Assignee: Donnelly Corporation

( * ) Notice: Subject to any disclaimer, the term of this patent is extended or adjusted under 35 U.S.C. 154(b) by 0 days.

This patent is subject to a terminal disclaimer.

(21) Appl. No.: 09/758,518

(22) Filed: Jan. 11, 2001

Related U.S. Application Data

(63) Continuation of application No. 09/149,227, filed on Sep. 8, 1998, now Pat. No. 6,173,501, which is a continuation of application No. 08/823,469, filed on Mar. 24, 1997, now Pat. No. 5,802,727, which is a continuation of application No. 08/457,621, filed on Jun. 1, 1995, now Pat. No. 5,632,092, which is a continuation of application No. 08/142,509, filed on Oct. 25, 1993, now Pat. No. 5,644,851, which is a continuation-in-part of application No. 07/811,578, filed on Dec. 20, 1991, now Pat. No. 5,255,442.

(51) Int. Cl.$^7$ .............................................. G01C 17/28
(52) U.S. Cl. .............................. 33/356; 33/361; 33/333; 324/252
(58) Field of Search .......................... 33/356, 361, 333, 33/340, 355 R, 357, 354; 324/252

(56) References Cited

U.S. PATENT DOCUMENTS

| 1,946,710 A | 2/1934 | Pickard |
| 3,683,668 A | 8/1972 | Baker et al. |
| 3,942,258 A | 3/1976 | Stucki et al. |
| 4,309,828 A | 1/1982 | Sakamoto |
| 4,445,279 A | 5/1984 | Tsushima et al. |
| 4,525,671 A | 6/1985 | Sansom |
| 4,546,550 A | 10/1985 | Marchent et al. |
| 4,581,827 A | 4/1986 | Higashi |
| 4,720,992 A | 1/1988 | Hormel |
| 4,733,179 A | 3/1988 | Bauer et al. |
| 4,738,031 A | 4/1988 | Alberter et al. |
| 4,751,783 A | 6/1988 | Ina et al. |
| 4,797,841 A | 1/1989 | Hatch |
| 4,807,462 A | 2/1989 | Al-Attar |

(List continued on next page.)

FOREIGN PATENT DOCUMENTS

| GB | 8707218 | 3/1987 |
| GB | 2202635 | 9/1988 |

Primary Examiner—Christopher W. Fulton
(74) Attorney, Agent, or Firm—Reising, Ethington, Barnes, Kisselle, Learman & McCulloch, P.C.

(57) ABSTRACT

An electronic compass is described for use in vehicles. The compass employs a magnetoresistive sensor for sensing the earth magnetic field and the sensor is operated in alternate set/reset bias modes. In a first embodiment, the compass is provided with deviation compensation by a closed loop system including measurement of the sensor output signals and an offset current strap for nullifying the vehicle deviation field. In a second embodiment, deviation compensation is provided by operation in an initial calibration mode and by operation in a normal compensation mode to adjust compensation, as needed, on a long term basis during normal operation of the compass. In the initial calibration mode, while the vehicle is being driven, the signal peak values are adjusted to a nominal earth field level by changing the offset current. Then, compensating signal reference values for each axis are determined as each peak for that axis is determined. The system automatically exits the initial calibration mode when certain criteria have been met. In the normal compensation mode, the signal reference value for each axis is adjusted at least once during the time interval between turn-on and turn-off of the vehicle ignition switch.

46 Claims, 21 Drawing Sheets

U.S. PATENT DOCUMENTS

| | | |
|---|---|---|
| 4,862,594 A | 9/1989 | Schierbeek et al. |
| 4,866,627 A | 9/1989 | Suyama |
| 4,953,305 A | 9/1990 | Van Lente et al. |
| 4,989,333 A | 2/1991 | Helldorfer et al. |
| 5,090,231 A | 2/1992 | Gallagher |
| 5,095,631 A | 3/1992 | Gavril et al. |
| 5,105,548 A | 4/1992 | Fowler |
| 5,124,648 A | 6/1992 | Webb |
| 5,131,154 A | 7/1992 | Schierbeek et al. |
| 5,170,566 A | 12/1992 | Fowler et al. |
| 5,187,872 A * | 2/1993 | Dufour ........................ 33/356 |
| 5,255,442 A * | 10/1993 | Schierbeek et al. ........... 33/361 |
| 5,287,297 A | 2/1994 | Ihara et al. |
| 5,297,063 A * | 3/1994 | Cage ........................... 33/356 |
| 5,390,122 A * | 2/1995 | Michaels et al. .............. 33/356 |
| 5,440,484 A * | 8/1995 | Kao ............................ 33/356 |
| 5,511,319 A * | 4/1996 | Geerlings et al. .............. 33/356 |
| 5,632,092 A * | 5/1997 | Blank et al. .................. 33/356 |
| 5,644,851 A * | 7/1997 | Blank et al. .................. 33/356 |
| 5,802,727 A * | 9/1998 | Blank et al. .................. 33/356 |
| 6,173,501 B1 * | 1/2001 | Blank et al. .................. 33/356 |

* cited by examiner

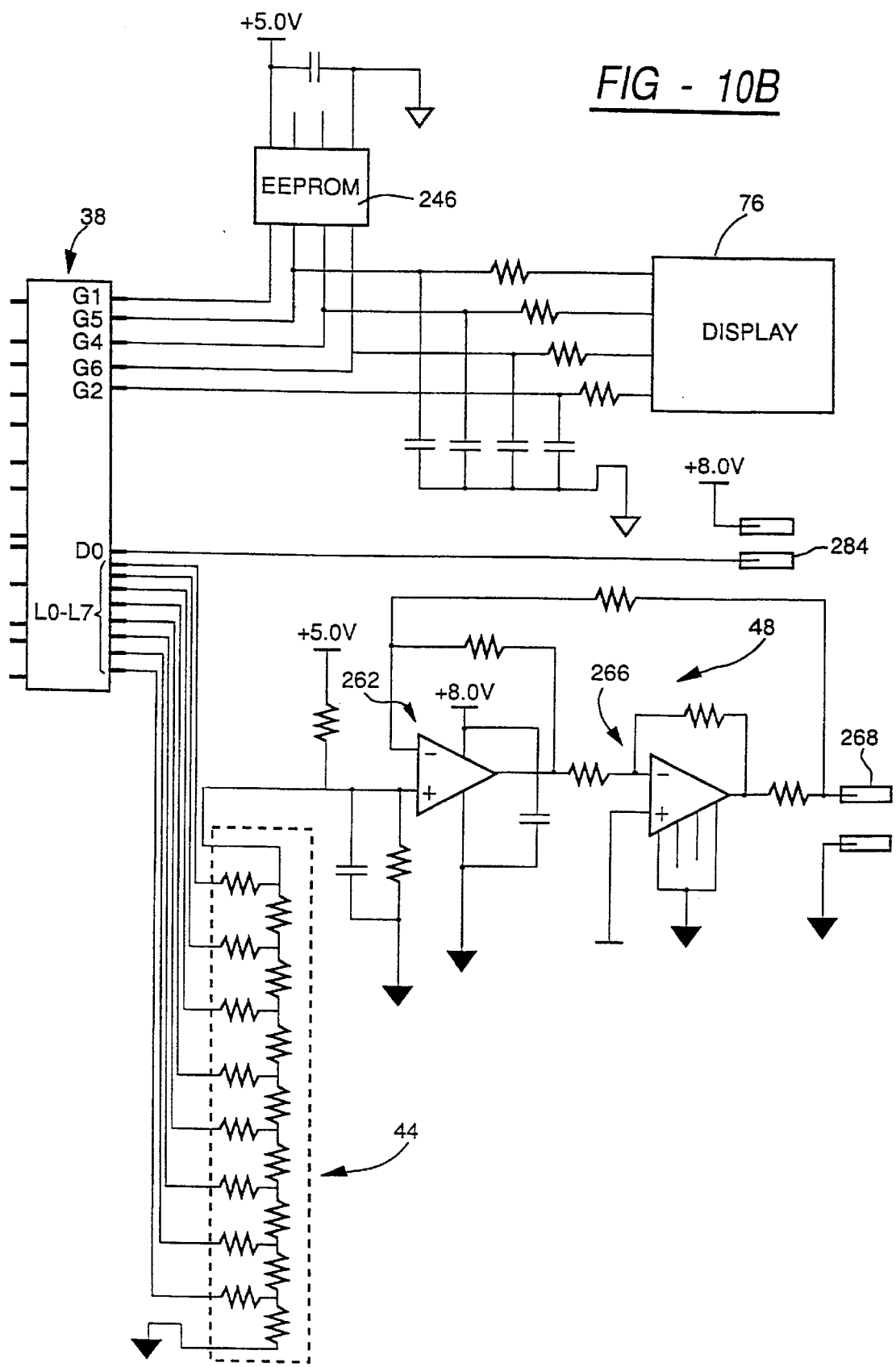

COMPENSATION SYSTEM FOR ELECTRONIC COMPASS

This application is a continuation of U.S. Ser. No. 09/149,227 filed Sep. 8, 1998, which matured into U.S. Pat. No. 6,173,501, granted Jan. 16, 2001, which is a continuation of U.S. Ser. No. 08/823,469, filed Mar. 24, 1997, which matured into U.S. Pat. No. 5,802,727, granted Sep. 8, 1998; which is a continuation of U.S. Ser. No. 08/457,621, filed Jun. 1, 1995, which matured into U.S. Pat. No. 5,632,092, granted May 27, 1997; which is a continuation of U.S. Ser. No. 08/142,509, filed Oct. 25, 1993, which matured into U.S. Pat. No. 5,644,851, granted Jul. 8, 1997; which is a continuation-in-part of U.S. Ser. No. 07/811,578, filed Dec. 20, 1991, which matured into U.S. Pat. No. 5,255,442, granted Oct. 26, 1993.

FIELD OF THE INVENTION

This invention relates to magnetic compasses for vehicles. More particularly, it relates to compasses of the type which utilize an electronic magnetic field sensor.

BACKGROUND OF THE INVENTION

Magnetic compasses are commonly used in vehicles, including land vehicles, boats and aircraft, as an aid in direction finding and navigation. There is an increasing demand for magnetic compasses especially for use in passenger cars. In this field of use, there is an increasing requirement for a compass of low cost which exhibits a relatively high degree of accuracy with great reliability and which is of small size and weight.

Magnetic compasses for vehicles may be classified according to the type of the magnetic field sensor. One type is a magnetic rotor sensor which utilizes a magnetized element rotatably mounted to align itself with the ambient magnetic field. Examples of this type of vehicle compass are disclosed in Schierbeek et al U.S. Pat. No. 4,862,594 granted Sep. 5, 1989 and in application Ser. No. 07/597,854 filed Oct. 15, 1990 by Schierbeek et al now U.S. Pat. No. 5,131,154, granted Jul. 21, 1992. Said patents are assigned to the same assignee as this application.

Another type is a flux gate sensor which utilizes a saturable magnetic core with excitation and sense windings for sensing the direction and field strength of an ambient magnetic field. Examples of vehicle compasses with flux gate sensors are represented by Baker et al U.S. Pat. No. 3,683,668 granted Aug. 15, 1972; Bower et al U.S. Pat. No. 4,733,179 granted Mar. 22, 1988; Hormel U.S. Pat. No. 4,720,992 granted Jan. 26, 1988; and Van Lente et al U.S. Pat. No. 4,953,305 granted Sep. 4, 1990.

There is a need, especially in vehicle compasses for passenger cars, for an improved magnetic field sensor to achieve the goals of accuracy, reliability, small size and weight and low cost. However, one of the problems in meeting these goals is that of providing deviation compensation for the compass, which is required to provide a high degree of accuracy, without a large cost penalty. It is known that a magnetic compass installed in a vehicle must be calibrated in the vehicle to account for the disturbing effect of the vehicle magnetic field. It is known that vehicles produce a magnetic field due to the presence of ferromagnetic materials, electric current carrying wires and the like and this magnetic field interferes with the earth field at locations within and adjacent the body of the vehicle. The magnetic field sensor of a compass responds to the localized magnetic field in which it is immersed for the purpose of direction finding with reference to the earth magnetic field. The magnetic field vector produced by the vehicle, herein referred to as the deviating magnetic field vector, combines with the earth magnetic field vector to produce a resultant or external magnetic field vector which, without calibration or compensation is unsuitable for reliable and accurate direction finding. Fully automatic deviation compensation is needed to meet present-day demands for passenger cars.

It is known to provide deviation compensation in a magnetic compass with a rotor type sensor by use of a pair of compensation coils which are energized with current to generate a magnetic field which is equal and opposite to the deviating magnetic field. This method of deviation compensation requires the vehicle to be oriented in certain cardinal directions relative to magnetic north and adjustments of coil current must be made. This adjustment may be carried out by the vehicle driver or it may be automated in a computer controlled compass. It results in inaccuracy unless the vehicle heading is accurately aligned relative to magnetic north. Deviation compensation of this type is disclosed in the above cited Schierbeek U.S. Pat. No. 4,862,594.

Another method of deviation compensation for vehicle compasses is referred to as the one hundred eighty degree compensation method. In this, the resultant magnetic field is measured with the vehicle in any selected orientation relative to the magnetic north and then the resultant field is measured with the vehicle in an orientation displaced one hundred eighty degrees from the first orientation. Using the measured values of the magnitude and directions of the resultant fields, the deviating field is calculated for both magnitude and direction. The calculated value is stored and subtracted from the magnetic field measurements subsequently taken by the compass in use for direction finding to thereby compensate it for deviation. The use of this method for a flux gate compass is disclosed in the above cited Bower U.S. Pat. No. 4,733,179, the Hormel U.S. Pat. No. 4,720,992 and the Baker et al U.S. Pat. No. 3,683,668.

Fully automatic deviation compensation systems for vehicle compasses have been proposed wherein no manual intervention is required. In the Tsushimo U.S. Pat. No. 4,445,279, granted May 1, 1984 an automatic system is disclosed using a flux gate sensor. An A-to-D converter and microprocessor are used to calculate an offset correction to compensate for the deviating field of the vehicle after driving the car in a full circle. A fully automatic compensation system is described in the Al-Attar U.S. Pat. No. 4,807,462 granted Feb. 28, 1989. In the system of this patent, a flux gate sensor measures three headings with the car moving, and using the headings, the coordinates are derived for the center of the earth field circle and the directional offset values are computed by using the coordinates. Another fully automatic deviation compensation system is described in the Van Lente U.S. Pat. No. 4,953,305 cited above. In this system, a flux gate sensor is used and the maximum and minimum signal values are recorded while the vehicle is driven through a closed loop. Then, the value of the deviating vehicle field is calculated from the recorded values. The compensating current is applied to the respective X and Y axis sense coils of the flux gate sensor to nullify the deviating field.

In the prior art, it is proposed to use magnetoresistive sensors in magnetic compasses. Such a compass is shown in the Picard U.S. Pat. No. 1,946,170 granted Feb. 13, 1934 wherein the magnetoresistive elements are connected in a bridge circuit. A compass using thin film magnetoresistive sensors is described in the Stucki et al U.S. Pat. No. 3,942,258 granted Mar. 9, 1976. In this system three magnetoresistive sensors are disposed in orthogonal relationship to develop a signal corresponding to the angular relationship between the compass platform and the magnetic north. The sensors are provided with a pumping coil and an output coil wound around the film at ninety degrees to each other. The pumping coil applies an alternating bias magnetic field to the magnetoresistive film. The Sansom U.S. Pat. No. 4,525,671 granted Jun. 25, 1985 describes a magnetoresistive sensor with a single magnetoresistive element capable of sensing two components of a magnetic field. A current strap extends parallel to the magnetoresistive element and other current strap extends at right angles to the magnetoresistive element. One of the current straps carries current in alternate directions during a periodic cycle while the other strap carries current in a single direction. Another magnetic compass comprising a magnetoresistive thin film is disclosed in UK patent application 8707218 published Sep. 28, 198. Two pairs of magnetoresistive thin films are arranged at right angles to each other. Means are provided to produce a biasing magnetic field and to measure a change in electric resistivity of the magnetoresistive material. The Boord et al U.S. Pat. No. 4,533,872 granted Aug. 6, 1985 describes a magnetoresistive thin film sensor of particular configuration for use as an electronic sensor in a compass.

As indicated above, the prior art is replete with vehicle compass technology in great detail. While the use of magnetoresistive sensors for compasses is suggested in the prior art, practical application requires an acceptable technique for fully automatic deviation compensation in a vehicle. Even though the prior art includes many different methods of deviation compensation for vehicle compasses, the art is lacking in respect to deviation compensation for magnetoresistive sensors.

A general object of this invention is to provide an improved vehicle compass using a magnetoresistive sensor which overcomes certain disadvantages of the prior art.

SUMMARY OF THE INVENTION

In accordance with this invention, a vehicle compass is provided which provides a high degree of accuracy and reliability with small size and weight and which is of low cost. This is accomplished using a thin film magnetoresistive sensor provided with a current conductor for providing switchable magnetic bias and a current conductor for nullifying a deviating field.

Further, in accordance with a first embodiment of this invention, an electronic compass is provided which employs a closed loop system to nullify deviating magnetic fields.

Further, in accordance with a second embodiment of this invention, an electronic compass is provided which automatically operates in an initial calibration mode to determine the initial compensation for the particular vehicle installation and in a normal calibration mode which is operative during normal compass operation for adjusting calibration as may be needed. In the initial calibration mode, the signal peak values are adjusted to a nominal earth field level by changing the offset current. Compensating signal reference values for each axis are determined as each peak for that axis is determined. In the normal compensation mode, the sensor signals are sampled and stored during compass operation in its direction indicating mode. When a new peak is acquired for one axis, which should occur at the signal reference value in the orthogonal axis, an adjustment value is stored and later used to adjust the compensating signal reference value. The signal reference value for each axis is adjusted at least once for each peak of the orthogonal axis during the time interval between turn-on and turn-off of the vehicle ignition switch.

A complete understanding of this invention may be obtained from the detailed description that follows taken with the accompanying drawings.

DESCRIPTION OF THE DRAWINGS

FIGS. 10A and 10B taken together form a schematic diagram of electronic circuits, including the microcomputer, which are coupled with the circuits of FIGS. 8 and 9 of the compass;

FIGS. 15A1, 15A2, and 15B taken together constitute a flow chart representing a program executed by the microcomputer for the initial calibration mode of operation;

BEST MODE FOR CARRYING OUT THE INVENTION

Figure 1:
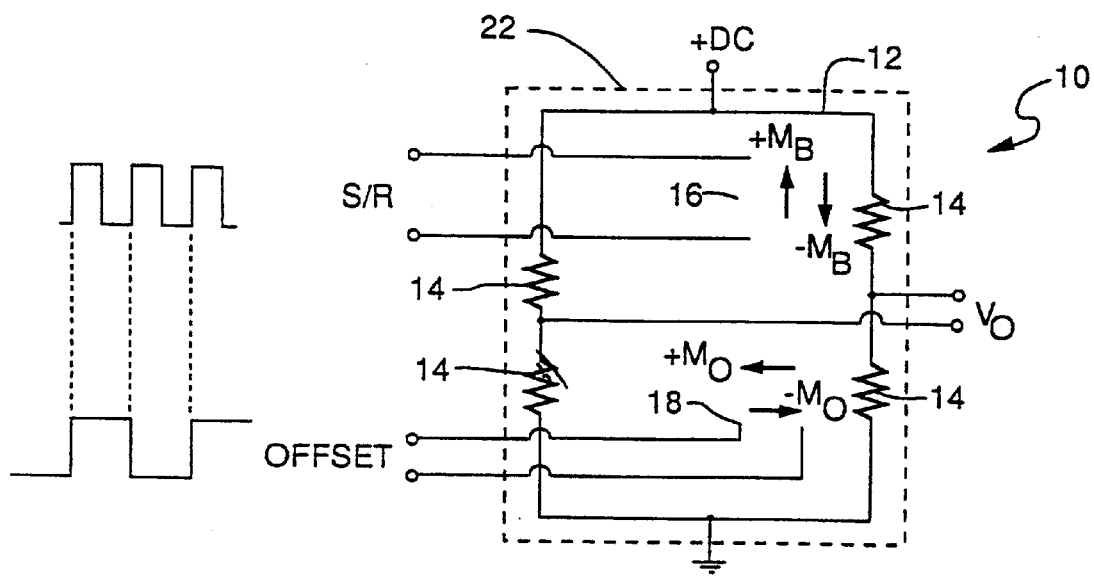
FIG. 1 depicts a single-axis magnetoresistive sensor.

Referring now to the drawings, there is shown an illustrative embodiment of the invention in a magnetic compass for vehicles which utilizes a magnetoresistive sensor. It will be appreciated as the description proceeds that the invention is useful in other applications and may be realized in different embodiments.

FIRST EMBODIMENT OF THE INVENTION
Magnetoresistive Sensor

Before describing the compass of this invention, it will be helpful to consider the magnetoresistive sensor used in the compass. A single-axis magnetoresistive sensor is illustrated schematically in FIG. 1. The sensor 10 comprises a bridge circuit 12 including a set of four magnetoresistive elements 14 connected in the bridge circuit. The magnetoresistive elements 14 are formed of a magnetic material which exhibits the magnetoresistive effect, such as permalloy, which changes its resistivity in the presence of an external magnetic field. The bridge circuit 12 is excited with a DC voltage across the input terminals and an output signal voltage $V_O$ is developed across the output terminals in response to an external magnetic field. The sensor 10 is provided with a bias current strap 16 which is energized by a set/reset voltage at its input terminal to produce a magnetic bias field $M_B$ which is of reversible polarity in accordance with the input voltage. Also, the sensor 10 is provided with an offset current strap 18 which is energized by a reversible polarity offset voltage applied to its input terminals. The current strap 18 produces an offset magnetic field $M_O$ which is reversible polarity in accordance with the input signal voltage. The functions of the bias current strap 16 and the offset current strap 18 will be discussed subsequently.

Preferably, the sensor 10 is fabricated on a silicon substrate on which the magnetoresistive elements 14 are deposited as a thin film. In this construction, the bias current strap 16 is formed as a current conductive layer. It overlays a soft magnetic layer which in turn overlays the elements 14. A pulse of current in one direction through the current strap 16 produces a magnetic field of sufficient strength to saturate the magnetic layer and provide a positive bias field. When the current is removed, the device remains in a biased condition under the influence of the magnetic layer. Similarly, a pulse of current in the opposite direction provides a negative bias. The offset current strap 18 is formed as a current conductive layer which overlays the magnetoresistive elements 14 and carries current in a direction perpendicular to the current carrying direction of the strap 16. The offset magnetic field $M_O$ produced by the current strap 18 is effective to oppose an external magnetic field to which the magnetoresistive elements 14 are subjected. Magnetoresistive sensors constructed by the deposition of a thin film ferromagnetic material on a silicon substrate are well-known in the art, as indicated by the Boord U.S. Pat. No. 4,533,872.

Figure 2:
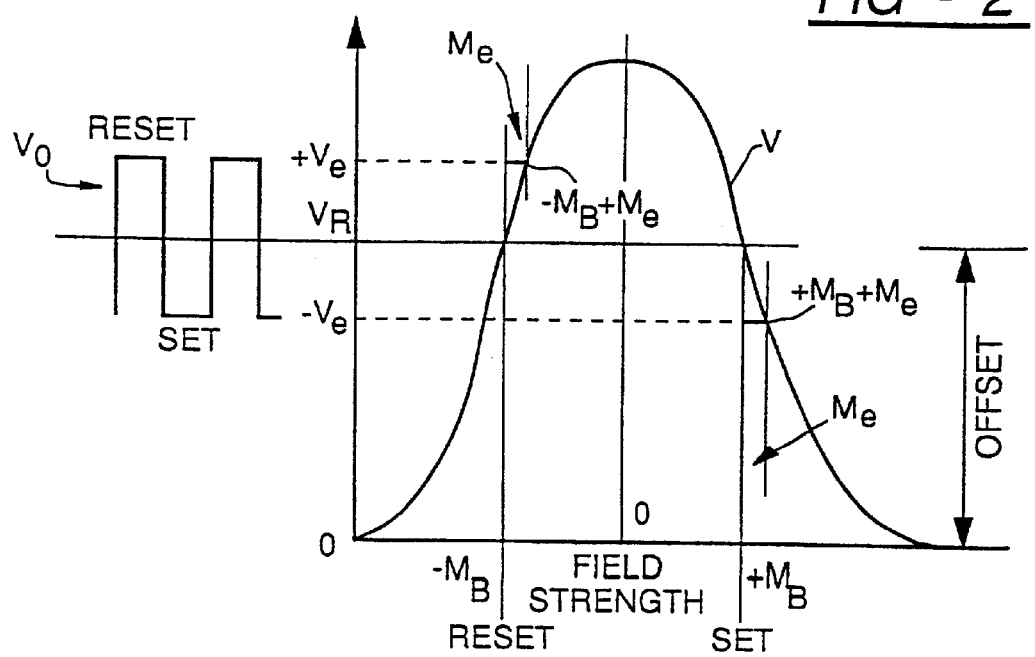
FIG. 2 is a graphical representation of the operation of a single-axis magnetoresistive sensor.

The operation of the sensor 10 will be described with reference to the graph of FIG. 2. The curve V represents the output voltage of the sensor 10 as a function of magnetic field strength in a direction perpendicular to the current flow in the magnetoresistive elements 14. When the field strength is zero, the output voltage V has a maximum value and as the field strength is increased from zero in either direction, the output voltage decreases symmetrically. (The terms 'positive' and 'negative' and the symbols therefor are used in a relative sense to denote opposite directions or polarity of magnetization.) The voltage curve near the peak is highly non-linear and tends to become substantially linear in a mid-range of the voltage variation. In order to obtain directional information regarding an external magnetic field, a bias field having a field strength alternating between $+M_B$ and $-M_B$ is applied to the magnetoresistive elements 14. This is accomplished by the bias current strap 16 and the associated soft magnetic layer which is alternately driven into magnetic saturation by current pulses of alternate polarity through the current strap 16. When a current pulse is applied in one direction the device will operate with a positive bias, $+M_B$, which herein is called the "set model" until the saturation of the soft iron magnetic layer is reversed. A current pulse in the opposite direction will reverse the direction of saturation and the device will operate with a negative bias, $-M_B$, herein called the "reset model".

When the device is operated in the alternating set/reset modes and when subjected to zero field strength, the output voltage V will have a value $V_R$ in the set mode and also in the reset mode so that the output voltage remains constant at the $V_R$ level. When the sensor 10 is subjected to an external magnetic field $M_e$, the external field is combined with the bias field $M_B$. As shown in FIG. 2, if the external field is of positive polarity, i.e. $+M_e$, it will add to the bias field $+M_B$ to produce a resultant field strength $M_B + M_e$ which results in an output voltage $-V_e$. In the reset mode, the external field $+M_e$ decreases the bias field $-M_B$ to produce a net field strength of $-M_B + M_e$. This produces an output voltage in the reset mode of $+V_e$. Thus, the output voltage of the sensor 10, when subjected to an external magnetic field of $+M_e$, is an alternating square wave voltage of the same frequency as the alternating square wave voltage applied to the bias current strap 16. The output voltage varies from a positive peak value of $+V_e$ in the reset mode to a negative peak value of $-V_e$ in the set mode. As indicated in FIG. 2, the peak-to-peak value of the output voltage $V_O$ represents the external field $M_e$. As will be discussed subsequently, the voltage $V_R$ is an offset voltage which is removed from the output voltage $V_O$ by AC coupling. It is noted further that if the output voltage $V_O$ is positive in the reset mode, the external field $M_e$ is positive and if the output voltage $V_O$ is positive in the set mode the external field is negative. It is only necessary to measure the positive portion of the output voltage $V_O$ to determine the magnitude of the external field and the direction of the external field $M_e$ will be known from its polarity and whether it is in the set or reset mode.

Vehicle Compass System

Figure 3:
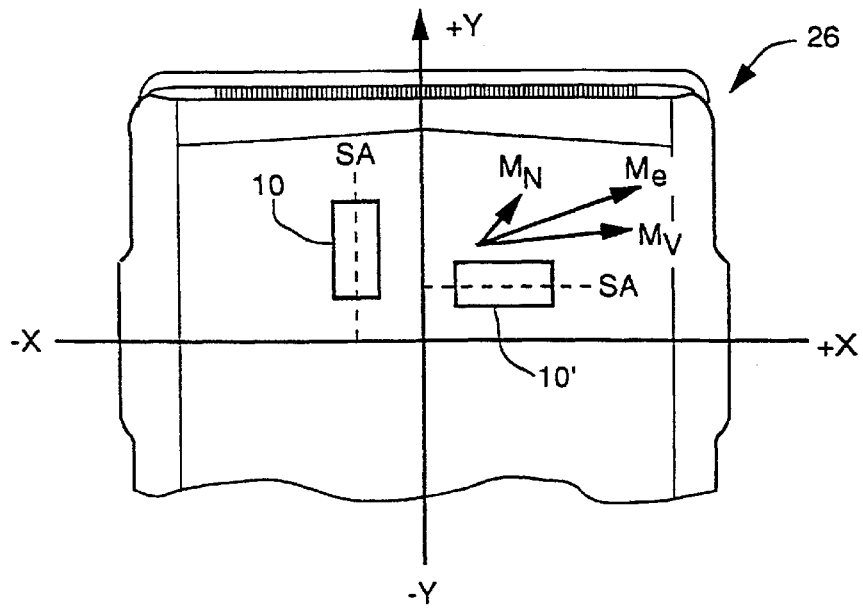
FIG. 3 is a diagram representing a typical relationship of the compass sensor and certain magnetic field vectors with the directional axis of a vehicle in which the compass of this invention is installed.

Now consider the sensor 10 installed in a vehicle 26, such as a passenger car, as depicted in FIG. 3. In order to determine the direction of the external field $M_e$, it is necessary to use two single-axis sensors 10 and 10' which are orthogonally oriented relative to each other. The sensor 10 is mounted in the vehicle with its sensitive axis SA parallel to the direction reference axis, i.e. the longitudinal axis Y—Y of the vehicle 26. The sensor 10' is of the same construction as sensor 10 and is mounted adjacent the sensor 10 with its sensitive axis extending parallel to the X—X axis of the vehicle. In such an installation, the sensors are subject to the earth magnetic field $M_N$ which is stationary with reference to the earth and it is also subjected to the vehicle magnetic field $M_V$ which is stationary with respect to the vehicle. The external field $M_e$ to which the sensor 10 is subjected is the vector sum of the earth field and the vehicle field. Accordingly, the sensor 10 responds to the Y-axis component of the vehicle field and the sensor 101 responds to the X-axis component. The vehicle field $M_V$ remains constant regardless of the direction heading of the vehicle 26. However, the external magnetic field $M_e$ includes a component due to the earth field $M_N$ and the output voltages of the sensors 10 and 10' vary with vehicle heading relative to the magnetic north direction, as will be discussed below.

Figure 4:
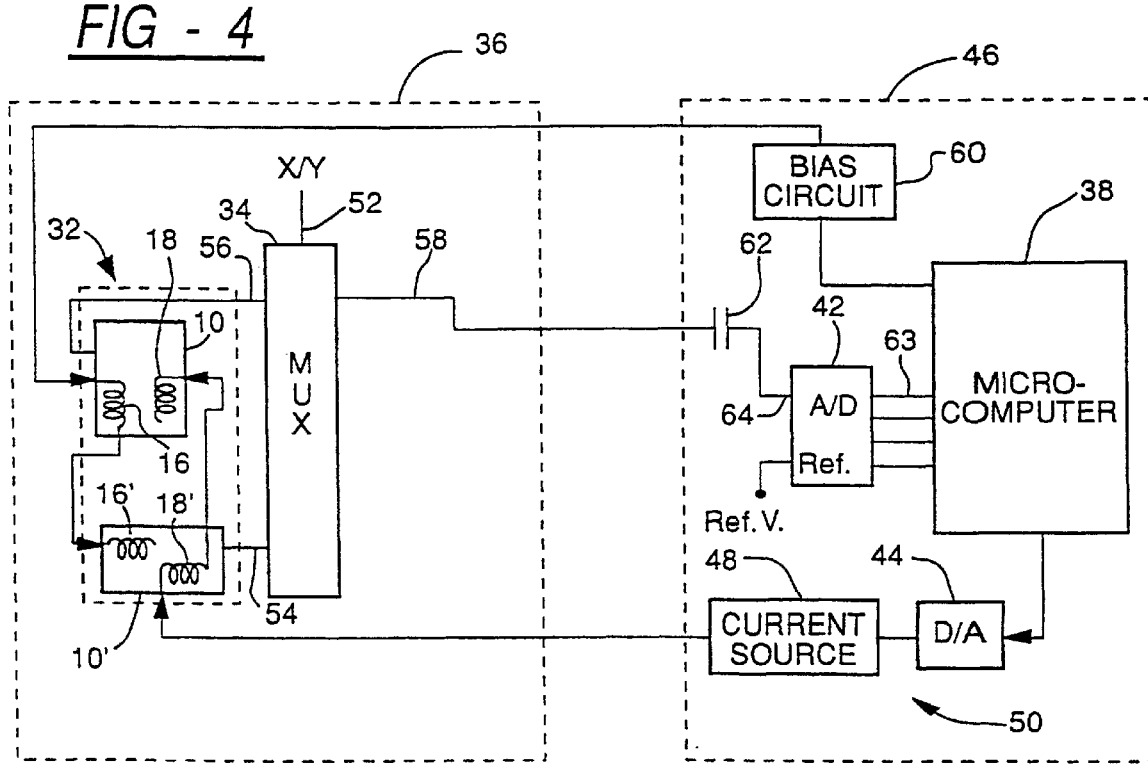
FIG. 4 is a block diagram of a compass embodying this invention.

The electronic compass of this invention is shown in block diagram in FIG. 4. In general, the compass comprises a two-axis sensor 32 and a multiplexer 34 which are mounted on a sensor circuit board 36. A mother board 46 mounts a microcomputer 38, an analog-to-digital converter 42 and a digital-to-analog converter 44 which controls a constant current source 48. The circuits of FIG. 4 are operative to measure the X and Y-axis output signals and to process the signals to eliminate the DC voltage offset and to nullify the effect of the vehicle deviating magnetic field to obtain deviation compensation of the compass. The microcomputer 38 is operated under a control program to process the signals to achieve deviation compensation and to compute the magnetic heading of the vehicle, as will be described subsequently.

The circuit of FIG. 4 will now be described in greater detail. The two-axis sensor 32 comprises the Y-axis sensor 10 and the X-axis sensor 10' mounted with respect to each other and the vehicle 26 as described above. The microcomputer 38 controls the switching of a sensor bias circuit 60 to bias the sensors alternately in the set and reset modes. A multiplexer 34 has an address select input 52 for selecting X or Y-axis output signals. The output signal of the Y-axis sensor 10 is applied to an input 56 of the multiplexer and the X-axis output signal of the sensor 10' is applied to an input 54 of the multiplexer. The output signal of the multiplexer at output 58 is coupled through a capacitor 62 to the input 64 of the A/D converter 42. The capacitor 62 provides AC coupling between the multiplexer output 58 and the A/D converter input 64 to block the DC offset voltage $V_R$ discussed above with reference to FIG. 2. Thus, the amplitude of the output voltages of the sensors 10 and 10' which must be measured by the A/D converter 42 is reduced by the value of the DC offset voltage.

The output of the A/D converter 42 is applied to inputs 63 of the microcomputer 38. The microcomputer 38 processes the digital signal outputs of the A/D converter 42 in accordance with an algorithm for determining the nullifying magnetic field for the respective X-axis and Y-axis sensors 10' and 10 to offset and nullify the effect of the deviating vehicle magnetic field on the sensors. This algorithm is embodied in the program (see FIG. 7) of the microcomputer 38 which will be described subsequently.

Deviation Compensation

Figure 5A:
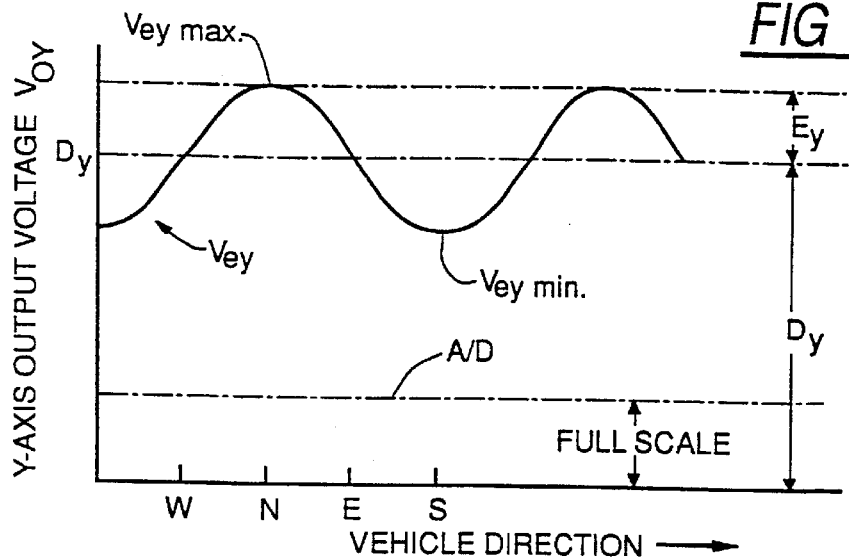
FIGS. 5A and 5B are a graphical representation of the operation of the compass of FIG. 4.

The manner in which the compass is compensated for deviation due to the vehicle magnetic field will be described, in general, with reference to FIGS. 5A and 5B. With the compass represented in FIG. 4 installed in the vehicle 26, as described with reference to FIG. 3, the output signal of the sensor 10 as it is applied through AC coupling to the input of the A/D converter 42 is represented by the waveform $V_{ey}$ in FIG. 5A. This signal $V_{ey}$ has an offset component $D_y$, prior to deviation compensation, which is of constant value and produced by the Y-axis component of the vehicle field. The Y-axis output signal $V_{ey}$ has an alternating component $E_Y$ which is produced by the earth magnetic field in accordance with the direction heading of the vehicle 26. The component $E_Y$ varies in a sinusoidal manner as shown in FIG. 5A relative to the signal level $D_y$ as the vehicle is driven through various directions relative to magnetic north. The waveform $V_{ey}$ of the Y-axis output signal may be produced over a relatively short time period or a long time period, it is depicted in FIG. 5A without regard to time. The output signal, instead, is plotted as a function of vehicle direction. When the vehicle is headed in the direction of magnetic north, the output signal $V_{ey}$ is at its maximum value $V_{eymax}$ and when it is headed in the magnetic south direction it is at a minimum value, $V_{eymin}$. When the heading is either west or east, the value of the Y-axis signal $V_{ey}$ is at the value of the deviation component $D_Y$ which is half way between the maximum and minimum values.

It is required to determine the current in the deviation offset strap 18 for nullifying the Y-axis component of the deviating magnetic field. For this purpose, the A/D converter 42 is set with a full-scale range of reading capability which is equal to or slightly greater than the maximum value of the earth field component $E_Y$ which occurs within the geographical range, such as the North American continent, in which the vehicle may be operated. This full scale range of the A/D converter 42 is represented by the signal voltage level designated A/D in FIG. 5A. The operation of the compass circuit to achieve the deviation offset current in strap 18 of the sensor 10 will be described subsequently.

Figure 5B:
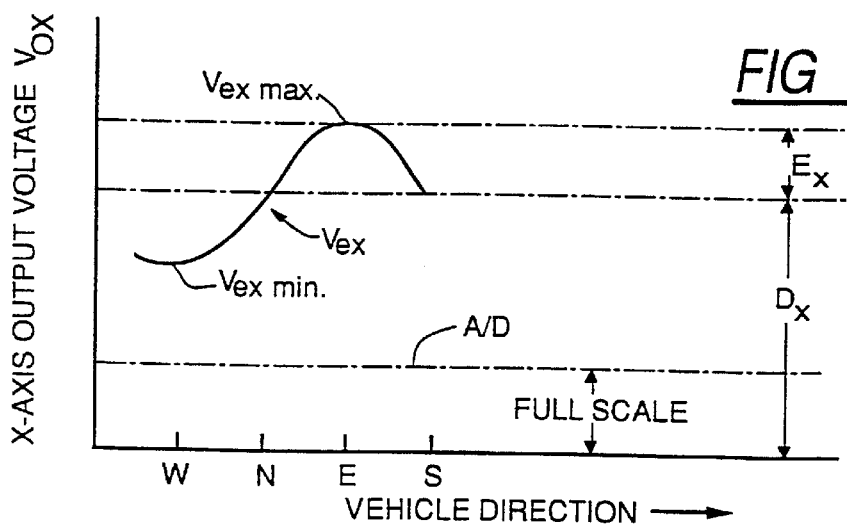

In a manner analogous to that described above for the Y-axis output signal of sensor 10, with reference FIG. 5A, the X-axis sensor 10' produces an X-axis output signal $V_{ex}$ has depicted in FIG. 5B. It is noted that this signal $V_{ex}$ has a component $D_x$ which is constant as a result of the X-axis component of the deviating vehicle field. It also has an alternating component $E_X$ due to the earth field which varies in accordance with the direction heading of the vehicle. However, the alternating component, while varying in a sinusoidal manner, is ninety degrees out-of-phase with the variable component $E_Y$ in the output signal of the Y-axis sensor 10. It is noted that the deviation component $D_X$ of the output signal $V_{ex}$ of the X-axis sensor 10' is typically different in magnitude from the deviation component $D_Y$ of the output signal $V_{ey}$ of the Y-axis sensor 10; the relative magnitudes depend upon the direction of the vehicle magnetic field vector $M_v$ and they are equal to each other only when the vector is at forty-five degrees or an odd multiple thereof relative to the longitudinal axis of the vehicle. On the other hand, the alternating component $E_X$ in the X-axis sensor output signal $V_{ex}$ has the same amplitude as the alternating component $E_Y$ in the output signal $V_{EY}$ of the Y-axis sensor 10. As indicated in FIG. 5B, the full scale range of the A/D converter 42, designated by the signal level A/D, is the same for the sampling of both the Y-axis and X-axis output signals by the A/D converter 42.

Compass Operation

The operation of the electronic compass will now be described with reference to FIGS. 4, 5A, 5B, 6 and 7. An accurate determination of the vehicle magnetic heading can be made only if the influence of the deviating magnetic field of the vehicle is nullified. When such nullification is achieved, the Y-axis and X-axis output signals correspond only to the components of the earth magnetic field and can be combined in a known functional relationship to determine the direction of the magnetic north vector. The operation of the magnetic compass for achieving nullification of the deviating magnetic field, for deviation compensation of the compass, will now be described.

Figure 6:
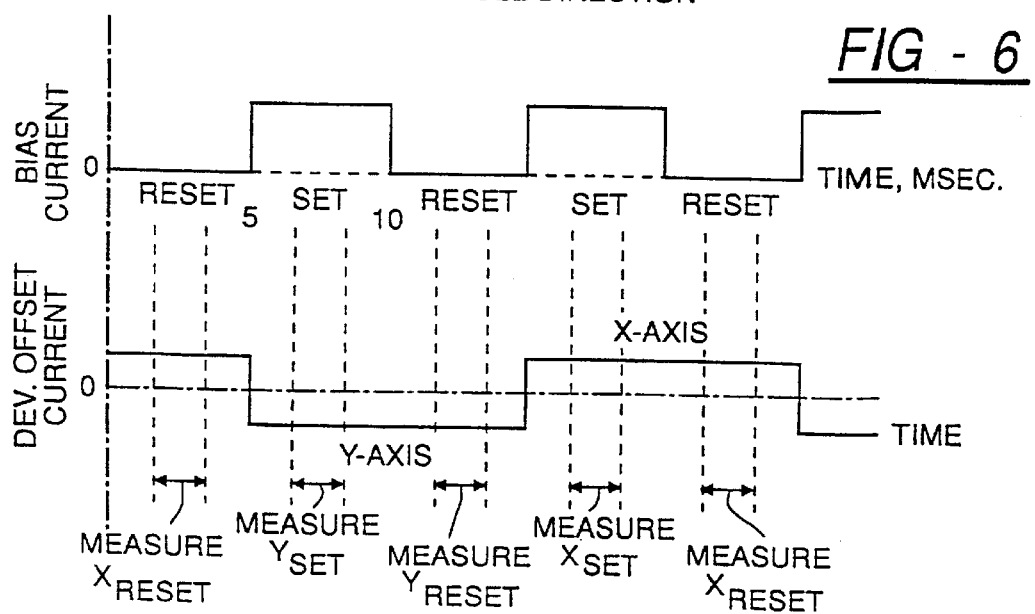
FIG. 6 is a timing diagram to aid in explanation.

A timing diagram depicting the operation for nullification of the deviating vehicle magnetic field and measurement of the earth magnetic field is shown in FIG. 6. The sensors 10 and 10' are alternately operated in the set mode and the reset mode simultaneously with each other under timing control signals from the microcomputer 38. In particular, the bias current straps 16 and 16' of sensors 10 and 10', respectively, are connected in series and are energized with the same current pulse in the reset direction for a reset period, say five milliseconds, and are energized with the same current pulse in the set direction for a set period, say five milliseconds. During the reset mode, as indicated in FIG. 6, the output signal of the X-axis sensor 101 is measured by the A/D converter 42. Initially, as indicated in FIG. 5B the amplitude of the output signal $V_{ex}$ is greater than the full scale of the A/D converter. As a result of such measurement, the microcomputer 38 produces an output signal to the D/A converter 44 which causes it to produce an increment of deviation offset current having a polarity, in the deviation offset current strap 18' of the sensor 10', such that it nullifies an increment of the X-axis component of the vehicle deviating field. Further, as shown in FIG. 6, during the set mode, the output signal of the Y-axis sensor 10 is measured by the A/D converter 42. Initially, as indicated in FIG. 5A, the value of the output signal $V_{ey}$ will be greater than the full scale of the A/D converter. As a result of this measurement, the microcomputer 38 will provide a control signal to the D/A converter 44 which causes the current source 48 to produce an increment of deviation offset current in the offset current strap 18 of the Y-axis sensor 10 with a polarity such that it nullifies an increment of the Y-axis component of the vehicle deviating field. Next, as indicated in FIG. 6, the output signal of the Y-axis sensor 10 is measured during the reset cycle. Following that, the output signal of the X-axis sensor 10' is measured during the set mode and then it is measured during the reset mode. For each output signal measurement which determines that the signal magnitude is greater than the full scale of the A/D converter 42, the current in the corresponding deviation offset current strap 18 or 18' is incrementally increased. This process continues until the deviation offset current in the current strap 18 of the Y-axis sensor is at a level within the full scale of the A/D converter 42 which is of such value that the Y-axis component of the vehicle deviating field is substantially nullified. The same is done with respect to the X-axis sensor. In this condition, the values of the Y-axis output signal and the X-axis output signal correspond accurately to the earth magnetic field for the particular vehicle headings during which measurements are made. The deviation compensation process is continuous during vehicle operation; the first cycle of compensation is completed when the vehicle has turned through a full circle from any arbitrary starting point. Turning of a full circle is indicated by the occurrence of the peak values $V_{eymax}$ and $V_{eymin}$ corresponding to the maximum and minimum output signals of the Y-axis sensor and the occurrence of $V_{exmax}$ and $V_{exmin}$ corresponding to the maximum and minimum values of the output signals of the X-axis sensor.

Figure 7:
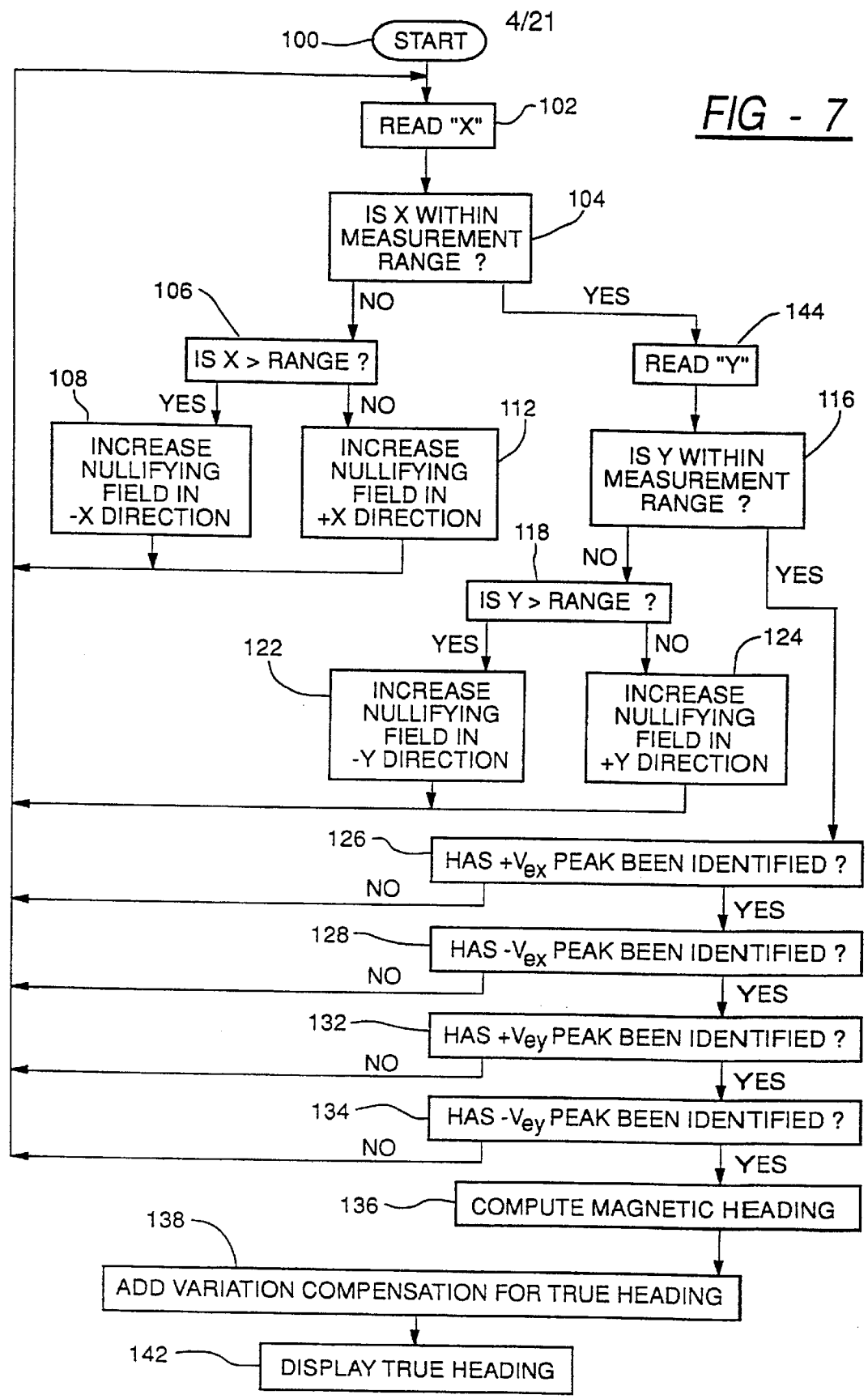
FIG. 7 is a flow chart representing the program executed by the microcomputer of the compass.

FIG. 7 is a flow chart representing the program of the microcomputer 38. At block 100, the execution of the program is started and it proceeds to block 102 which reads the output signal of the X-axis sensor 10'. In block 104 the program determines whether the value of the X-axis signal is within the full scale range of the A/D converter 42. If it is not, the program advances to block 106 which determines whether the value of X is greater than the full scale of the A/D converter 42. If it is, block 108 increases the nullifying field in the –X direction and the program loops back to block 102. If block 106 determines that X is not greater than the full scale, block 112 increases the nullifying field in the +X direction and the program loops back to block 102.

If at block 104 it is determined that the measured value of X-axis output signal is within the full scale range of the A/D converter 42, the program advances to block 144 which reads the measurement of the output signal of the Y-axis sensor 10. Then, block 116 determines whether the value of the Y-axis signal is within the full scale range of the A/D converter 42. If it is not, block 118 determines whether the value is greater than the full scale range. If it is, block 122 increases the nullifying field in the Y-axis sensor 10 in the –Y direction. Then, the program loops back to block 102. If at block 118 it is determined that the output signal of the Y-axis sensor is not greater than the full scale range of the A/D converter, block 124 increases the nullifying field of the Y-axis sensor in the +Y direction and the program loops back to block 102. This program execution is continued until at block 104 it is determined that the X-axis output signal is within the full scale range of the A/D converter 42 and further it is determined at block 116 that the output signal of the Y-axis sensor is within the full scale range. Then, the program advances to block 126 which determines whether the maximum value or positive peak of the output signal of the X-axis sensor 10' has been identified. If it has not, the program loops back to block 102. If it has, the program advances to block 128 which determines whether the minimum value or negative peak of the output signal of the X-axis sensor has been identified. If it has not, the program loops back to block 102; if it has, the program advances to block 132. Block 132 determines whether the maximum value or positive peak of the output signal of the Y-axis sensor has been identified. If it has not, the program loops back to block 102. If it has, the program advances to block 134. Block 134 determines whether the minimum value or negative peak of the output signal of the Y-axis sensor has been identified. If not, the program loops back to block 102. If it has, it is determined that the deviation compensation procedure has completed a full cycle.

In this state, the X-axis and Y-axis output signals correspond substantially to the earth magnetic field and are suitable for computing the magnetic heading of the vehicle. It will be understood that the process described is repeated continuously and adjusts the deviation compensation in accordance with changes in the vehicle magnetic field that may occur and to continually enhance the accuracy of the heading indication. When the block 134 determines that a full cycle of deviation compensation has been executed, the program advances to block 136 which computes the magnetic heading of the vehicle. Then, block 138 adds a stored value of variation compensation to obtain the true heading of the vehicle. The true-heading is displayed for the information of the vehicle driver by block 142.

Electronic Circuit Of The Compass

Figure 8:
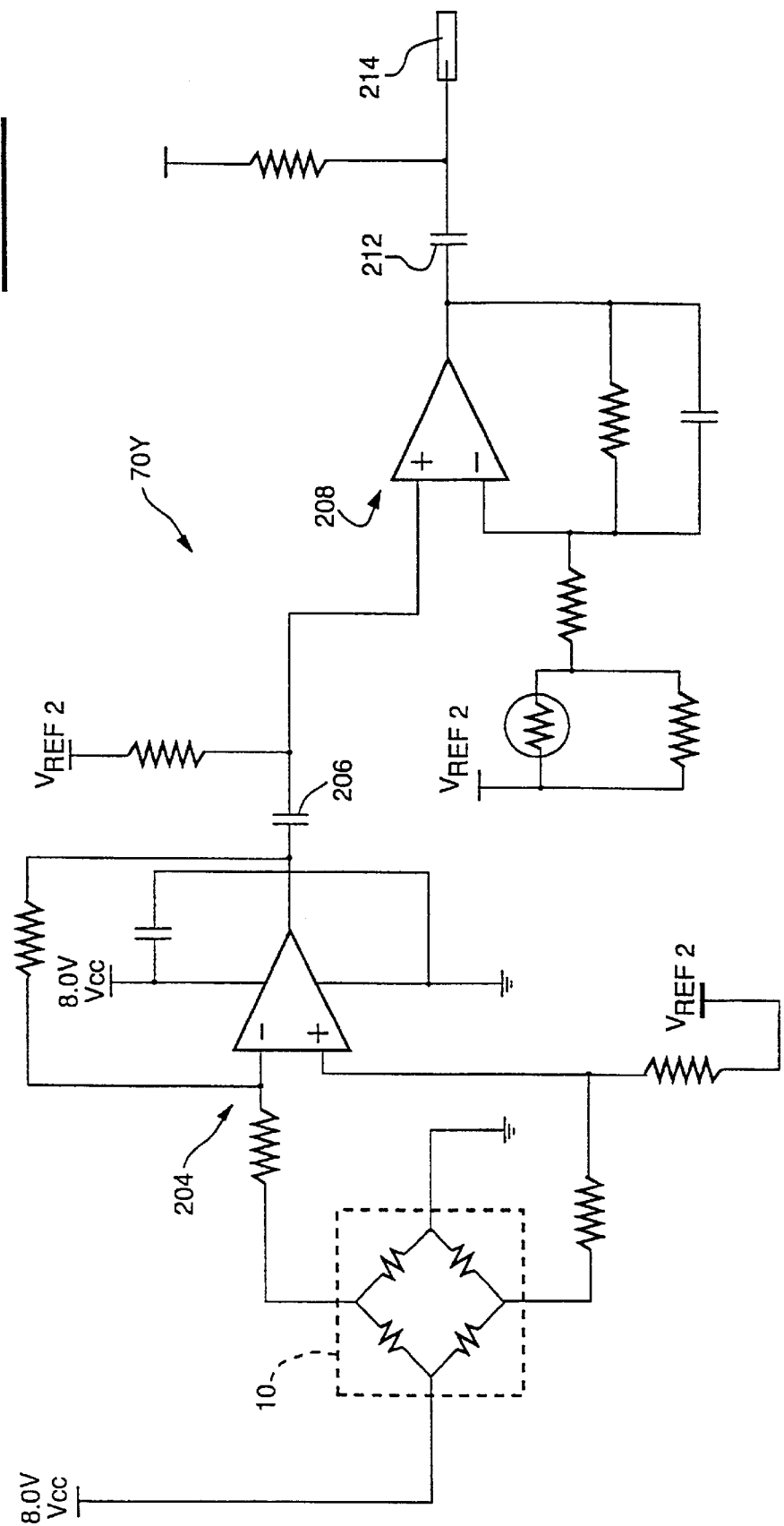
FIG. 8 is a schematic diagram of the Y-axis signal channel of the compass embodying this invention.

The circuit of the electronic compass is shown in the schematic diagrams of FIGS. 8, 9, 10A, 10B and 11. FIG. 8 shows the Y-axis signal channel 70Y for developing the output signal $V_{ey}$ from the output sensor 10. The bridge circuit of the sensor 10 is excited with a D/C voltage $V_{cc}$. The output of the bridge circuit is supplied to the input of a first stage amplifier 204 which provides a voltage gain of about ten or twelve. The amplified output is applied through an AC coupling capacitor 206 to the input of a second stage amplifier 208 which provides a gain of about twenty. The output of the amplifier 208 is applied through an AC coupling capacitor 212 to a terminal 214 for application of the signal $V_{ey}$ to the circuit shown in FIG. 10A which will be described presently.

Figure 9:
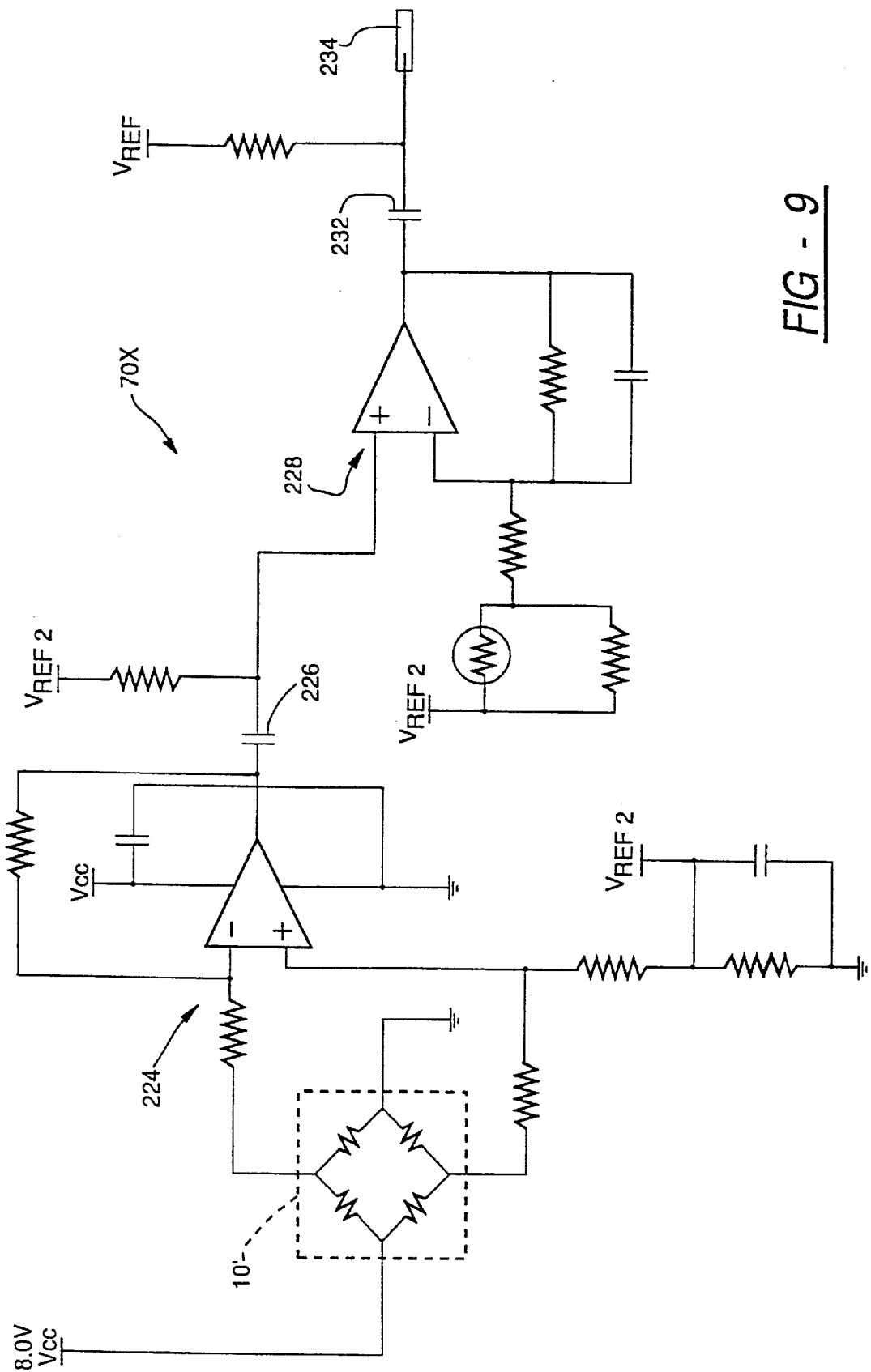
FIG. 9 is a schematic diagram of the X-axis signal channel.

The X-axis channel 70X for developing the output signal $V_{ex}$ from the output sensor 10' is shown in FIG. 9 and is similar to that of FIG. 8. The bridge circuit of the sensor 10' is excited with the DC voltage $V_{cc}$. The output of the bridge circuit is supplied to the input of a first stage amplifier 224 which provides a voltage gain of about ten or twelve. The amplified output is applied through an AC coupling capacitor 226 to the input of a second stage amplifier 228 which provides a gain of about twenty. The output of the amplifier 228 is applied through an AC coupling capacitor 232 to a terminal 234 for application of the signal $V_{ex}$ to the circuit shown in FIG. 10A which will be described presently.

Figure 10A:
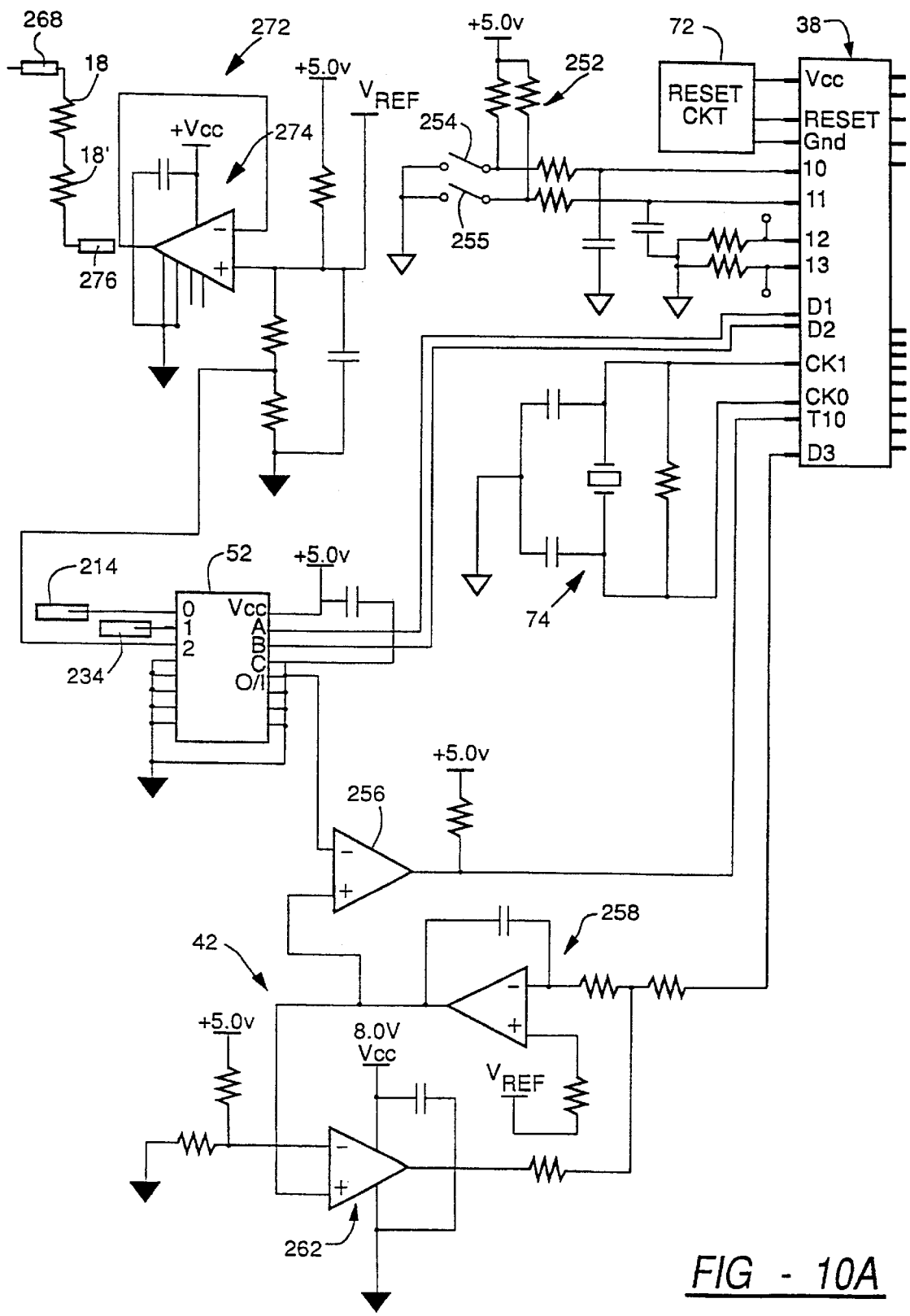

FIGS. 10A and 10B taken together form a schematic diagram of the electronic circuits, including the microcomputer 38, which are coupled with the circuits of FIGS. 8 and 9 described above and the circuit of FIG. 11 which will be described below. The microcomputer 38 is, in the illustrative example, an eight bit microprocessor type COP881C is available from National SemiConductor, Inc. of Palo Alto, Calif. As shown in FIG. 10A, the microcomputer 38 is provided with a reset circuit 72 of conventional design coupled with the pins $V_{cc}$, Reset and Ground as indicated. The microcomputer is also provided with a clock circuit 70, also of conventional design, and connected with the pins CK1 and CKO. As shown in FIG. 10B, the microcomputer 38 is coupled with an EEPROM 246 at pins G1, G5, G4, G6. The EEPROM 246 serves as a permanent memory for data to be stored when the power to the electronic circuit is interrupted. A compass heading display 76, such as a vacuum fluorescent display, is coupled to pins G5, G4 and G6. The display may be located in the vehicle at any location convenient for the driver remotely, if desired, from the location of the mother board 46. Referring again to FIG. 10A, a manual switching circuit 252 is coupled with microcomputer pins 10, 11, 12 and 13. A manual switch 254 is provided for use in connection with compensating the compass for variation. Also, a manual switch 255 is shown for changing the brightness of the display 248 but automatic means could be provided. The remaining circuits associated with the microcomputer 38, which will be described presently, are operative to control the sensors 10 and 10' and to process the output signals thereof to provide deviation compensation and to develop the heading direction signals. The heading is presented in alphanumeric form on the display 248 to indicate the cardinal and intercardinal compass points heading to the vehicle driver.

Figure 11:
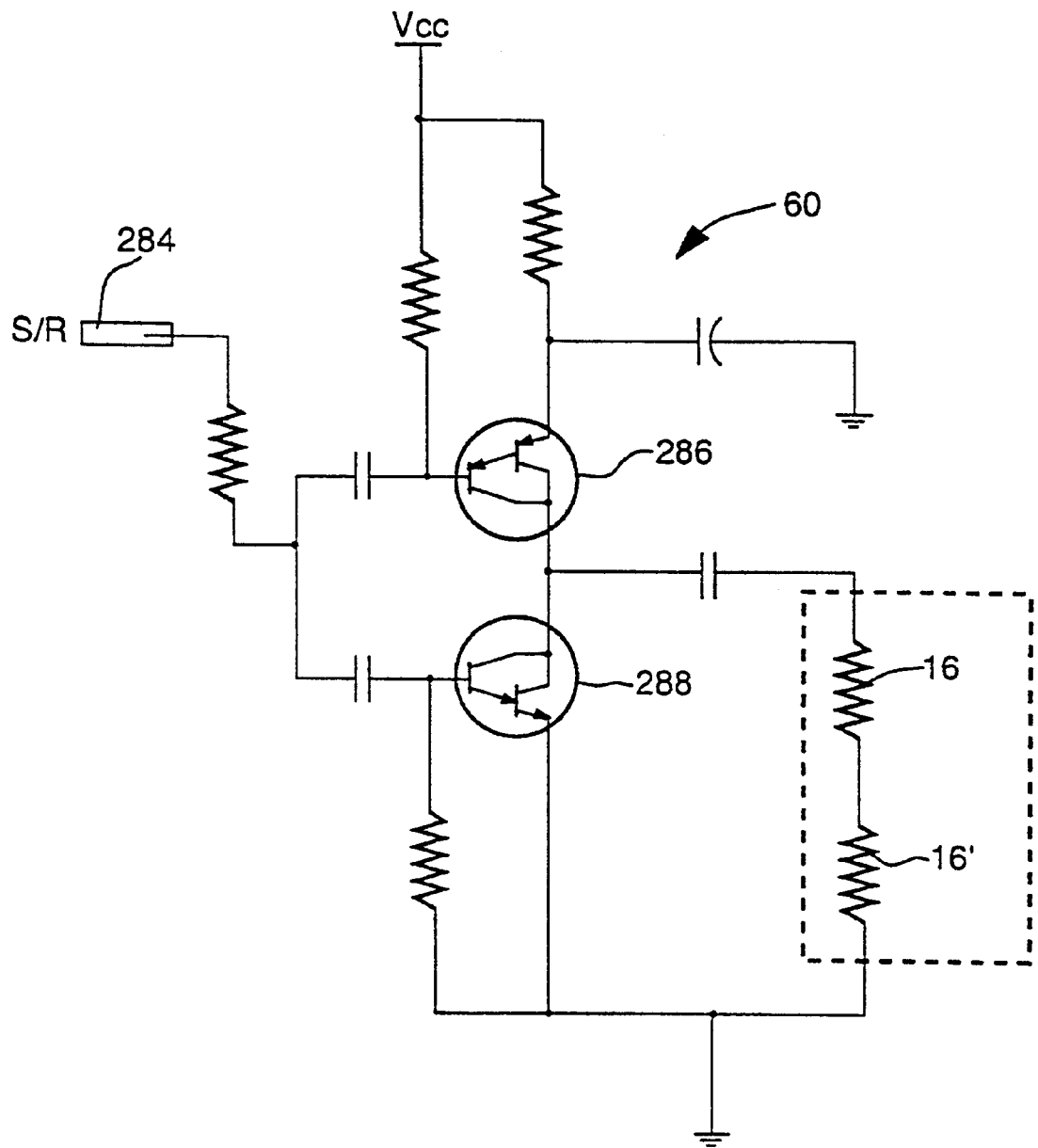
FIG. 11 is a schematic diagram of the bias current circuit for set and reset of the sensor.

A driver circuit 282 for the set/reset current straps 16 and 16' of the sensors 10 and 10' is shown in FIG. 11. The switching signal for the driver circuit 282 is produced by the microcomputer 38 at output pin D0 and applied to the input terminal 284. The driver circuit 282 comprises a pair of Darlington transistors 286 and 288 which are alternately switched conductive and non-conductive in response to the switching signal on connector 284. Accordingly, the current straps 16 and 16' are energized with current pulses as shown in the timing diagram of FIG. 6 and described above to provide the set and reset modes for the sensors 10 and 10' for the measurement of the Y-axis sensor output signal and X-axis sensor output signal, respectively.

As shown in FIG. 10A, the multiplexer 52 receives the Y-axis sensor output signal at terminal 214 and receives the X-axis sensor output signal at terminal 234. The multiplexer 34 is provided with an address signal from the data output pins D1 and D2 of the microcomputer 38 which is applied to pins A and B of the multiplexer 52. Thus, output signals of the Y-axis and X-axis sensors 10 and 10' are accessed alternately in timed relation with the set and reset modes as described with reference to FIG. 6. The sensor output signals are alternately outputted through pin 0/1 of the multiplexer to the A/D converter 42 shown in FIG. 10A. The A/D converter includes a comparator 256 which has its inverting input connected with the 0/1 output pin of the multiplexer 52. The non-inverting input of the comparator 256 is connected with the output of a ramp generator 258 which receives a pulsed input from pin D3 of the microcomputer 34. A clamp circuit 262 is coupled with the ramp generator 258 and clamps the ramp generator output at a certain voltage level so that the output does not go all the way to ground after each ramp which would require a time delay on build-up to the ramp reference voltage. The comparator 256 is operated with a reference voltage, for example, of about 2.5 volts on the non-inverting input. The A/D converter has a full scale range of 2.0 volts above the reference and, for example, the clamp voltage is about 2.3 volts. The ramp voltage is incremented at the rate of one millivolt per microsecond and the pulse count required to reach the signal voltage level at comparator 256 is stored in a register and represents the measured value of the sensor voltage applied to the A/D converter at comparator 256. The pulse count register indicates when the signal measurement is greater than the full scale range of the A/D converter 42.

As shown in FIG. 10B, the D/A converter 44 is coupled with output pins L0 through L7. The D/A converter 44 is a ladder network known as an R2R network and, for example, develops an output voltage of 2.5 volts at a register count of 127. The output of the D/A converter is applied through a voltage-to-current converter comprising amplifiers 262 and 266. The current amplifier 266 develops the offset current supply at connector 268 for the offset current straps 18 and 18' which are shown in FIG. 10A. The offset current return circuit 272 of FIG. 10A comprises an amplifier 274 which has its non-inverting input coupled with pin 2 of the multiplexer 52. The output of the amplifier 274 provides the offset current return at the terminal 276. The operation of the A/D converter 42 and the D/A converter 44 for developing the offset current required to provide deviation compensation is described above with reference to FIGS. 5A and 5B.

SECOND EMBODIMENT OF THE INVENTION

A second embodiment of the invention will now be described with reference to FIGS. 12 through 22. The second embodiment provides deviation compensation of the compass to a high degree of accuracy on a long term basis. This is accomplished by operation in an initial calibration mode followed by operation in a long term or normal calibration mode.

In initial calibration mode, the sensor output signals for each axis are alternately adjusted until they are within the full scale or readable range of the A/D converter. This is done by changing the offset current for each sensor by relatively large increments, if necessary, to produce readable sensor signals. The sensor signals are also alternately adjusted by incrementally changing the sensor offset current to adjust each sensor signal peak value so that it is approximately equal to a predetermined nominal earth field value. The predetermined nominal earth field value is selected for each sensor to be that which corresponds to the nominal earth field which is to be encountered. Once the sensor signal peak values are adjusted to the nominal level, so that they are readable by the A/D, by the sensor offset current adjustment, a signal reference compensating value for each axis is determined using the maximum and minimum signal peak values as each peak is acquired for each axis. The signal reference value for each of the X-axis and Y-axis sensors is stored when it is determined.

The normal calibration mode is operative during normal compass operation, i.e. when the compass is being used in its operational mode for directional or heading information. During normal operation, since the sensors have already been adjusted to a nominal earth field value and the compensating signal reference values determined, the compensating signal reference values are adjusted for each axis by a fixed step size, preferably two counts, as each new peak is determined on the opposite or orthogonal axis. An axis can be calibrated upon the occurrence of every new peak. During normal compensation, the compensating signal reference values for each axis may be adjusted once, and preferably, twice, once for each new peak in the opposite axis during each ignition or power-up cycle of compass operation.

A complete description of the initial calibration mode and the normal operation calibration mode will be given below.

Electronic Circuit

Since certain portions of the electronic circuit of the Second Embodiment correspond to the First Embodiment described above, only a brief description will be given.

Figure 12A:
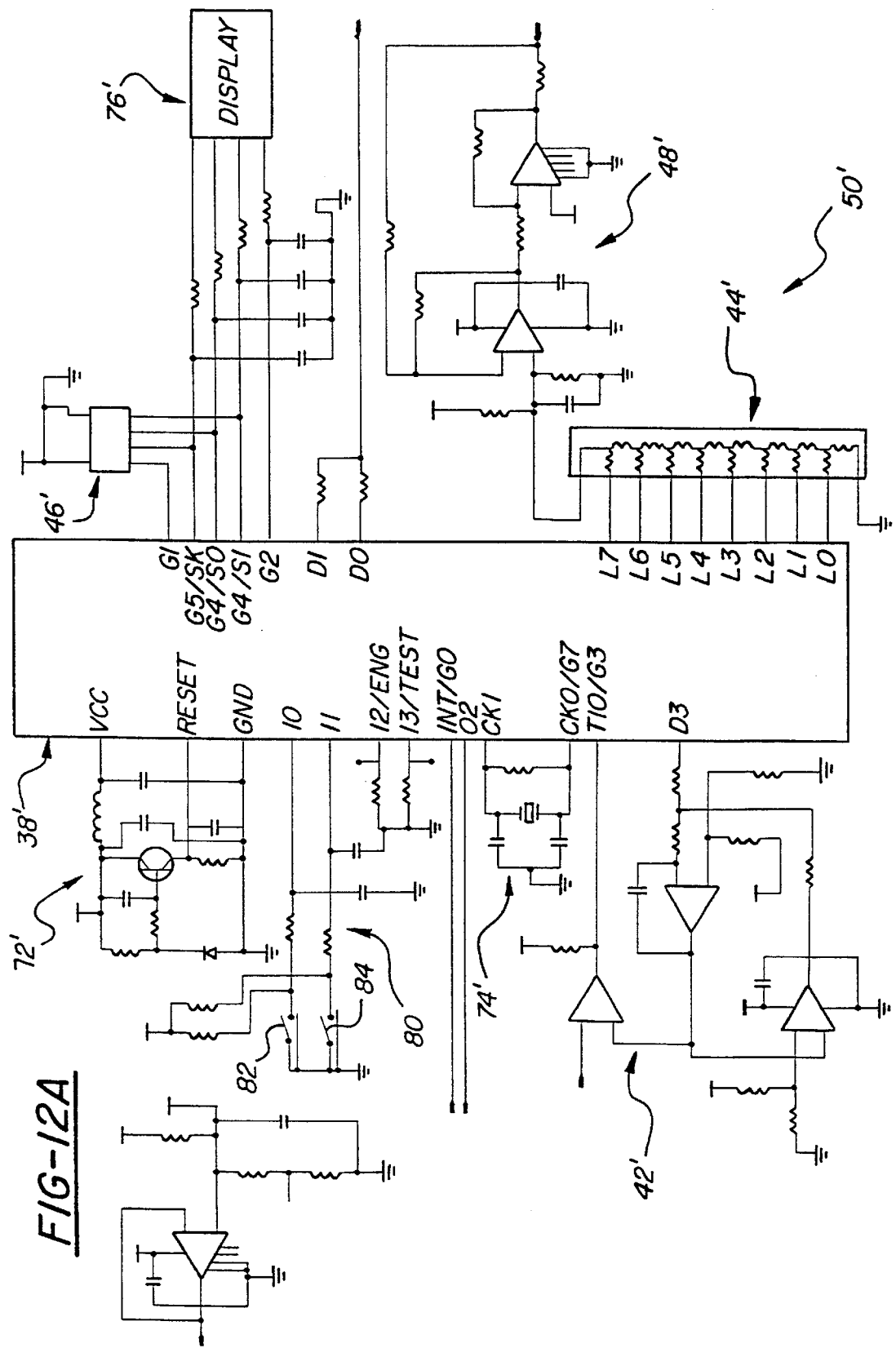
FIGS. 12A and 12B taken together constitute a schematic circuit of the electronic compass of a second embodiment of this invention.
Figure 12B:
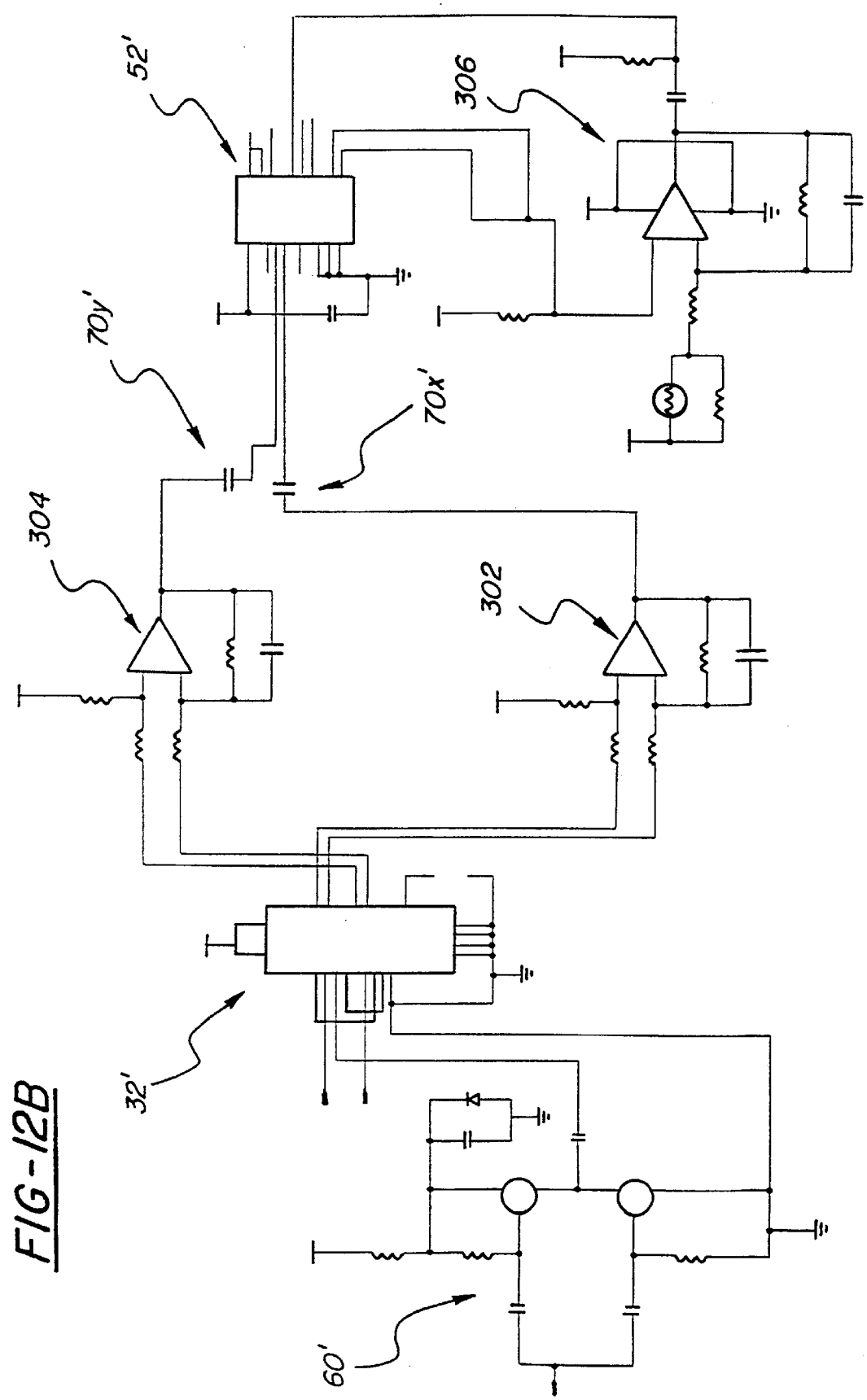

The compass electronic circuit, as shown in FIGS. 12A and 12B, comprises a microcomputer 38' with support circuitry, a single slope A/D converter 42', an offset circuit 50' including an eight bit D/A converter 44' driving a constant current source 48', an EEPROM 46', a two-axis magnetoresistive (MR) sensor 32', sensor bias circuitry 60', and amplifier circuitry 70Y' and 70X' with a multiplexer 52'. The microcomputer 38' is an eight bit COP881C microcomputer available from National SemiConductor, Inc., and is provided with a reset circuit 72' coupled with the $V_{cc}$, Reset and Ground pins, and a clock circuit 74' connected with the pins CKI and CKO. The microcomputer 38' is coupled to the non-volatile EEPROM memory 46' for data storage. A compass heading display 76', such as a vacuum fluorescent display, is also be coupled to the microcomputer 38'. The heading may be presented in alphanumeric format to display the octant (cardinal and intercardinal) compass headings to the vehicle operator. A calibrate switch 82 and a zone switch 84 described herein are also coupled with the microcomputer 38' in a switching circuit 80. The sensor set/reset driver circuit 60' comprises a pair of Darlington transistors Q2 and Q3 which are switched alternately between conductive and non-conductive states by a microcomputer switching signal, and are used to bias the MR sensors, as is described below.

The two-axis sensor 32' includes two magnetoresistive (MR) sensors 10 and 10' (see FIG. 4) for determining the X (east/west) and Y (north/south) components of a sensed magnetic field. Each of the MR sensors has a bias strap 16 and a current strap 18 as previously described with reference to FIGS. 1 and 4. The bias strap 16 is used to apply a set/reset signal to bias the MR sensor in two states. Since the MR sensors are is biased in two states, the A/D converter 42', which is a twelve bit converter, only has to read positive data. The readable A/D range is set to be slightly greater than the maximum earth field of about 300 Mgauss. Only about 3,000 steps (i.e., 3,000 mv) of the twelve bit A/D are used as the readable A/D range. The current strap is used to adjust the MR sensor output signals to a nominal earth field level within the readable A/D range.

The X and Y sensor output signals are coupled through first and second stage amplifiers 302 and 304 to the inputs of the multiplexer 52', and thence the amplified X and Y outputs are coupled to a shared second stage amplifier 306 (having temperature compensation). The multiplexed X and Y sensor signals are then coupled through the shared A/D converter 42' to the microcomputer 38'. The microcomputer 38' determines whether either of the X and Y sensor signals are outside the readable A/D range. If so, the signal is repeatedly increased or decreased by changing the value on the D/A converter 44' until the sensor signal is within the readable range. If either the X or Y sensor signals is then not equal to the nominal earth field, the microcomputer determines the number of counts (steps) to apply to the D/A converter 44' to decrease or increase the current supplied to the current straps 18 for each of the MR sensors so as to adjust the MR sensor signals to a nominal earth field level within the readable A/D range. The nominal earth field level may, for example, be about 200 Mgauss.

The compass is provided with a manually actuated calibrate switch 82 and a manually actuated zone switch 84. The calibrate switch is used to enter the initial calibration mode by pressing and holding the calibrate button for a predetermined time, say about a half second. Once activated, the legend "CAL" is displayed on display 76' adjacent the location for display of the true vehicle heading to confirm to the operator that the calibrate switch actuation has put the compass in the initial calibration mode. The operator may then drive the vehicle in a suitable course to acquire sufficient peak (e.g., north) and peak set (e.g., north/south or east/west) information so that the microcomputer 38' can update the calibration data as each peak set (for the north/south or east/west axis) is acquired. After the vehicle has been driven in such a course, for example through the approximately two circles, the microcomputer will have counted six peaks (e.g., north or south). When a predetermined initial calibration criteria has been met, as described below, the compass will then automatically exit the initial calibration mode and "CAL" is no longer displayed.

The initial calibration mentioned above is further described, as follows. If the measured Y-axis sensor signal is out of the twelve bit A/D range (using about 3000 steps), then the Y-axis sensor signal is repeatedly increased or decreased by changing the value on the D/A 44' until the Y-axis sensor signal is within the readable A/D range. If the Y-axis sensor signal is not equal to the nominal earth field level, then the Y-axis sensor signal is again level shifted using the D/A 44' until it is equal to the nominal earth field. When a north/south peak set for the Y-axis is obtained, the compensating signal reference value to correct the readable sensor signal is determined by averaging the north and south peak values. The above steps are repeated for the X-axis, so that the X-axis sensor signal is adjusted to the nominal earth field level, and then the compensating signal reference value is determined by averaging the east and west peaks. Finally, the compass determines a scaling factor for the axis having the lower maximum output signal to account for any output variances between the X-axis and Y-axis sensors. This completes the initial calibration mode.

The normal calibration mode is always operative whenever the compass is being operated in its direction indicating mode. For normal calibration, since the MR sensors have already been adjusted to a nominal earth field level and the initial compensating signal reference values determined, the compensating signal reference values are automatically adjusted or updated for each axis whenever a new peak is determined for the opposite or orthogonal axis. As the vehicle is being driven during normal compass operation, the X-axis and Y-axis sensor data are sampled and stored. When a Y-axis peak (e.g., north or south) is obtained, the opposing X-axis (east/west) signal reference value may be adjusted or updated since a Y-axis peak should correspond to the reference value on the X-axis. Thus, the north/south or east/west axis is compensated whenever a new peak is obtained for its opposing axis. This may be done once for each peak such that each axis may be adjusted or compensated twice during any ignition or power-up cycle.

The zone switch 84 is used to compensate for the angular difference between magnetic and true north. There are fifteen zones (zones. 1 to 15), eleven of which cover the United States. The compass provides zones which vary about ±28 degrees from a center zone (zone 8). Within the United States, the variation from the center zone ranges from about −12 degrees to +28 degrees (zones 1 to 11). The zone entry mode is entered by actuating and holding the zone switch 84 until the current zone setting appears in the display. The display may then be cycled through zones 1 to 15 by repeatedly actuating the zone switch 84. When the desired zone is displayed, releasing the zone switch 84 will exit the zone entry mode and store the new zone setting in non-volatile memory.

To filter the MR sensor data, the compass is provided with a software filter in the form of a digital lag filter which will be described later. Additionally, to prevent the compass display from oscillating between two octants, such as "N" and "NE", the display is time dampened so that a new heading will not be displayed until the same heading data persists for about 1½ seconds. The display damping technique of the present embodiment will be described later.

Figure 13:
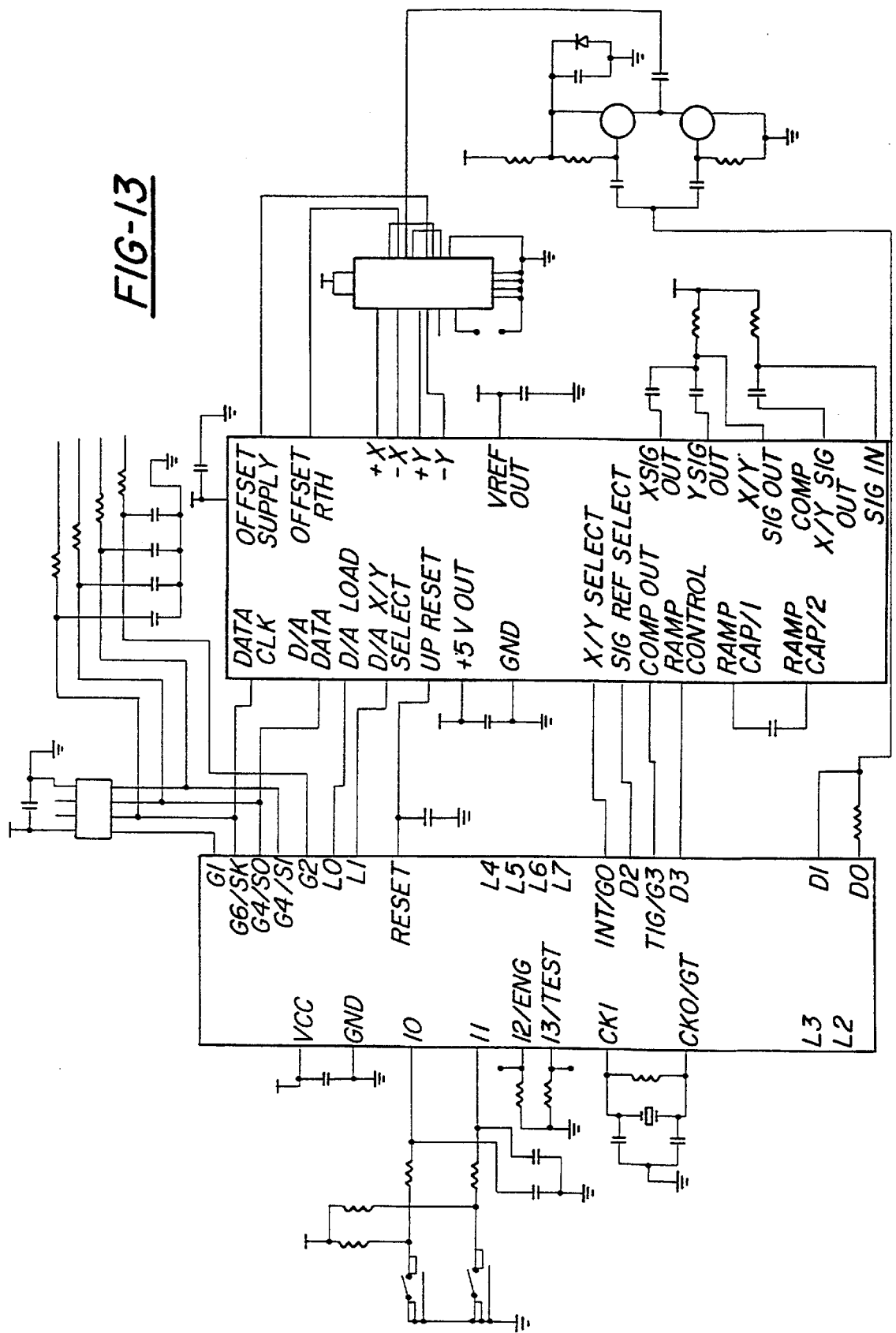
FIG. 13 is a modification of the electronic circuit.

An alternate electronic circuit is shown in FIG. 13. This circuit incorporates much of the support circuitry into an application-specification integrated circuit (ASIC). The drawing of FIG. 13 is self-explanatory.

Operation of the Second Embodiment

The operation of the second embodiment will now be described with reference to FIGS. 14 through 18. For convenience of explanation and understanding, the main loop of the control program will be described first with reference to FIGS. 14A and 14B. The initial calibration mode is depicted as a routine in the flow charts of FIGS. 15A and 15B. The normal calibration mode is depicted in the flow chart of FIG. 16. Additionally, a sensor offset voltage calculation is explained with reference to FIG. 17 and is shown in the flow chart of FIG. 18.

Main Loop Operation

Figure 14A:
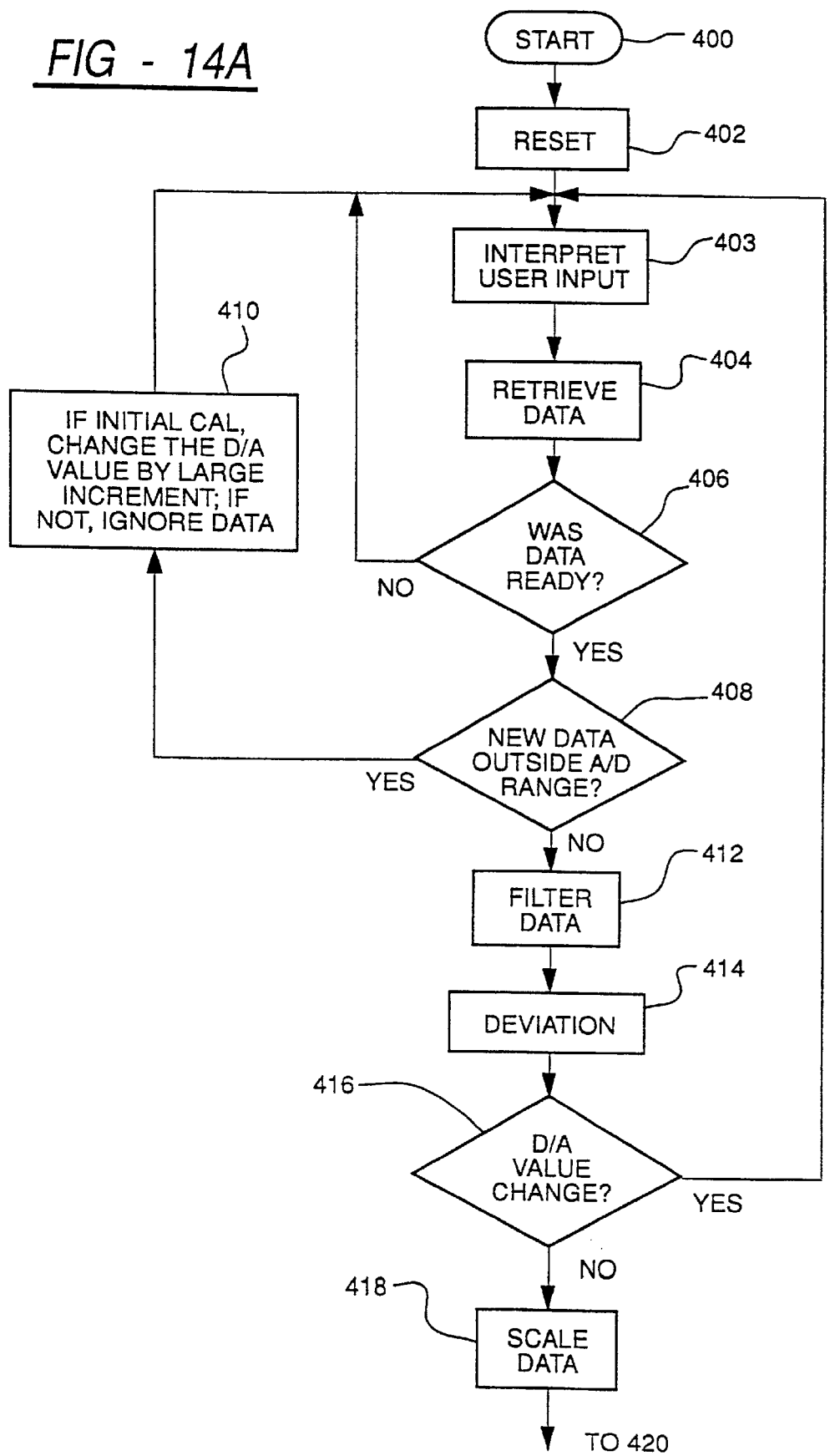
FIGS. 14A and 14B taken together constitute a flow chart representing the main loop of the control program executed by the microcomputer.
Figure 14B:
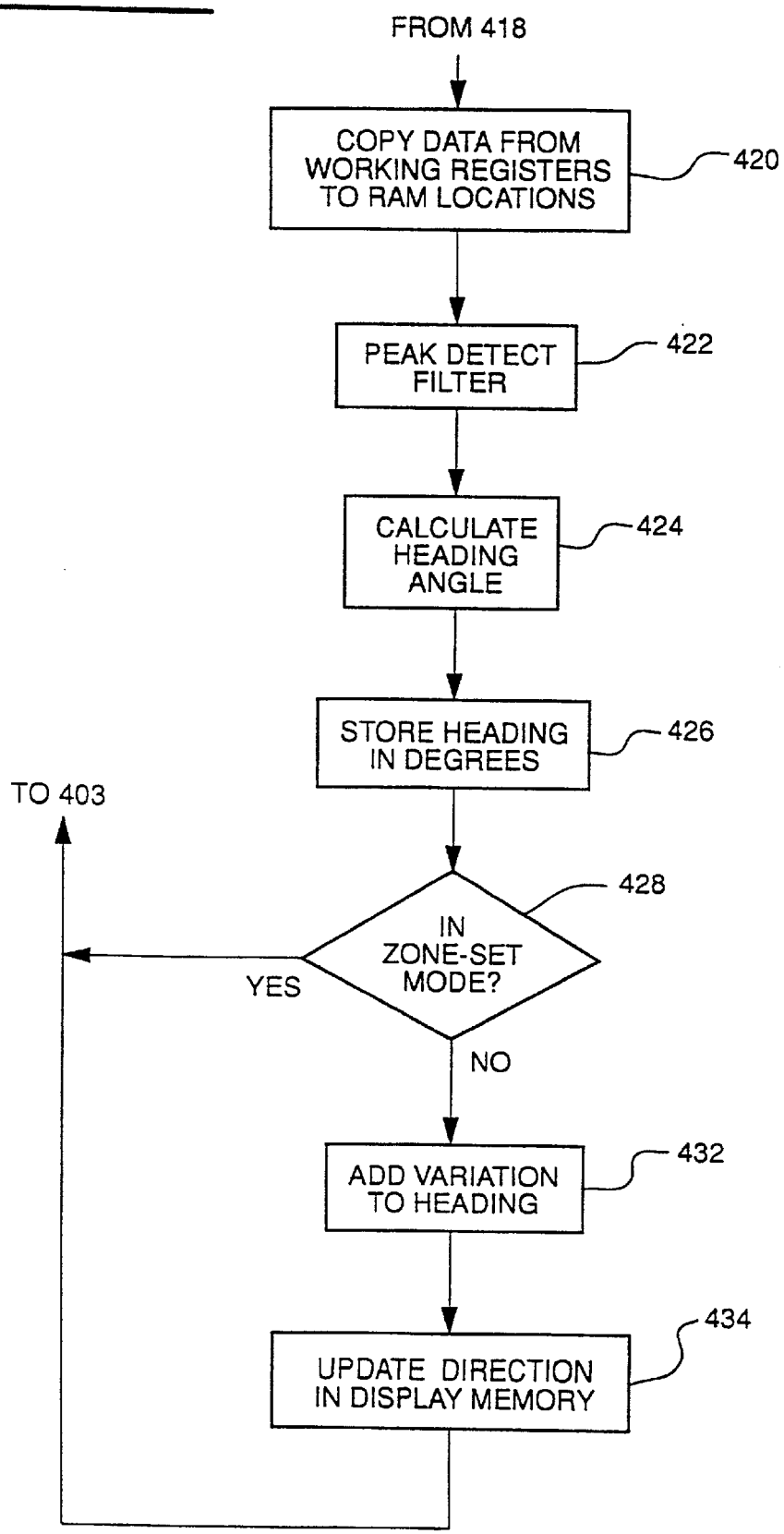
Figure 18:
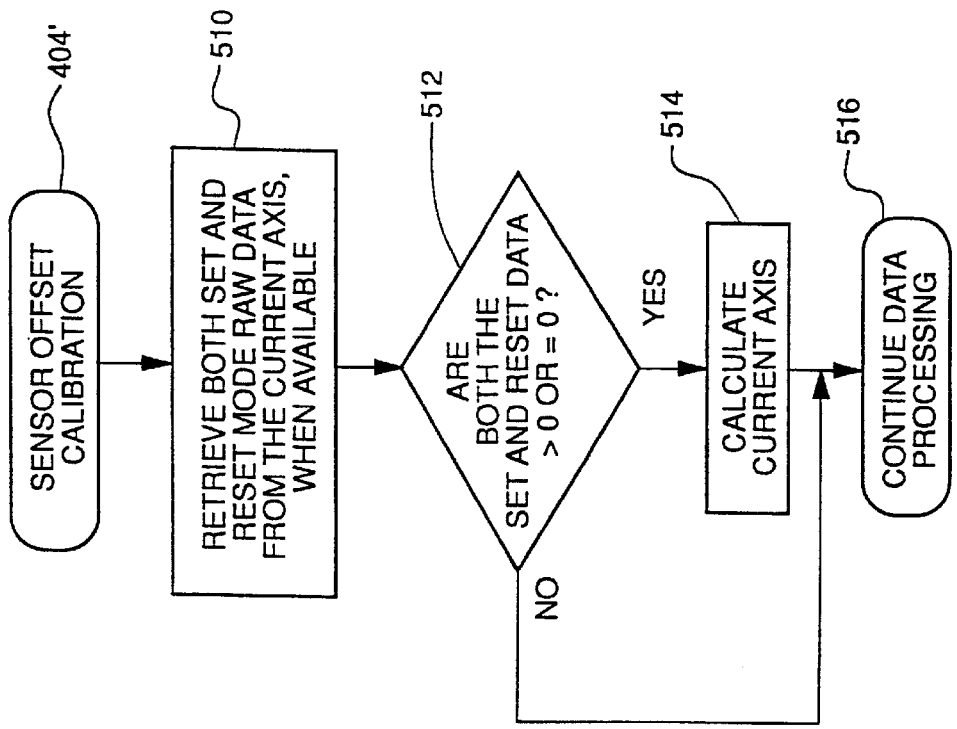
FIG. 18 is a flow chart representing a program executed by the microcomputer for calculating sensor offset.

Referring now to FIGS. 14A and 14B, the compass operation will be described with reference to the main loop of the control program of the microcomputer 38'. The program starts at the start block 400. The microcomputer is reset at block 402 when the ignition switch is turned on and the microcomputer is initialized for execution of the control program. The microcomputer will interpret any user inputs, as described herein, in block 403. The program advances to the retrieve data block 404 which causes the microcomputer to read the Y-axis and X-axis signals alternately at the output of the A/D converter 42'. A sub-routine for calculating the sensor offset voltage is incorporated in the retrieve data block 404 and will be described below with reference to FIG. 18. The program advances to the test block 406 which determines whether the data was ready for retrieval. If not, the program loops back to block 403 as indicated. If data was ready for retrieval, the program advances to a test block 408 which determines whether the new signal data is outside the readable range of the A/D converter 42'. If it is, the program advances to block 410. If the compass is in the initial calibration mode, this causes an eight count change in the D/A converter 44' setting to change the offset current through the current strap 18 of the corresponding Y-axis sensor or X-axis sensor to adjust the sensor signal such that it is within the readable range of the A/D converter. If the compass is in the normal operating mode, there is no operation in block 410. Next, the program loops back to block 403.

If at test block 408, the sensor signal is not readable by the A/D converter 42', the program advances to block 412 which filters the data, suitably by a digital lag filter, for the purpose of reducing noise in the sensor signal. In the embodiment as described, a digital lag filter having the form $$X_F(t)=X_F(t-1)+K^*(X_u(t)-X_F(t-1)),$$

where $X_F(t)$ is the filtered value at time (t), $X_F(t-1)$ is the filtered value at time (t-1), $X_u(t)$ is the unfiltered value at time (t), and if the compass is in initial calibration mode, $$\frac{1}{3+(X_u(t)-X_F(t-1))^2/8190}$$

or if the compass is in the normal operating mode, $$\frac{1}{3+(X_u(t)-X_F(t-1))^2/4096}$$

Then, the program advances to block 414 which compensates the compass for deviation resulting from the vehicle magnetic field. Block 414 represents a sub-routine which is depicted in the flow charts of FIGS. 15A, 15B and 15C which will be described in detail subsequently.

From block 414, the program advances to the test block 416 which determines whether the deviation compensation procedure of block 414 changed the output of the D/A converter 44' and hence the offset current in the current strap 18 of the sensor. If it did, the program loops back to block 403. If it did not, the program advances to block 418 which scales the data for the Y-axis or X-axis signal having the lower maximum output by applying a scaling factor to account for the difference in magnitude between the peak values of the X-axis and Y-axis signals. At block 420, new signal data is stored by copying data from the working registers to assigned locations in the random access memory (RAM) of the microcomputer 38'. Then, the program advances to block 422 which causes the microcomputer to detect the peak values of the signal data for each axis as they occur by examining the signal trend on each axis and to detect the difference between the signal reference value and the actual signal value of the opposite axis to determine the sign of the two count reference adjustment. The peak value and signal reference adjustment value for each axis are then stored in RAM as they are determined. Next, the program proceeds to block 424 which causes the microcomputer to determine the heading angle of the vehicle by using a known functional relationship wherein the heading angle is expressed as an arctangent function of the X-axis and Y-axis signals. In block 426 the heading angle, expressed in units of degrees, is stored in the RAM.

After the heading angle is stored by block 426, the program advances to the test block 428 which determines whether the compass is in the zone-setting mode. If it is, the program advances to block 403 which interprets the user input to control the display in accordance with such input. This permits the operator to select the geographical zone and the corresponding variation angle to compensate for the magnetic variation angle of the earth field from true north which depends upon the geographical location of the vehicle. If block 428 determines that the compass is not in the zone-setting mode, the program advances to block 432 which adds the variation compensation angle to the magnetic heading which was stored by block 426. This allows the microcomputer to develop an output signal which corresponds to the true heading of the vehicle. The program then advances to block 434 which updates the true heading signal which is stored in the display memory. This block also converts the heading, as expressed in degrees, to a heading angle expressed in one of the eight principal compass points, i.e. the cardinal and intercardinal points. Changes in the compass display are dampened using a four level progressive damping technique. Each level utilizes a progressively larger time duration. Typical time durations for each level, one through four, are 1.3 seconds, 1.8 seconds, 2.2 seconds, and 2.8 seconds, respectively. The damping level used for a display update corresponds to the number of octants by which the new display differs from the existing display. From block 434, the program loops back to block 403.

Initial Calibration Mode of Deviation Compensation

Figures 1, 15A:
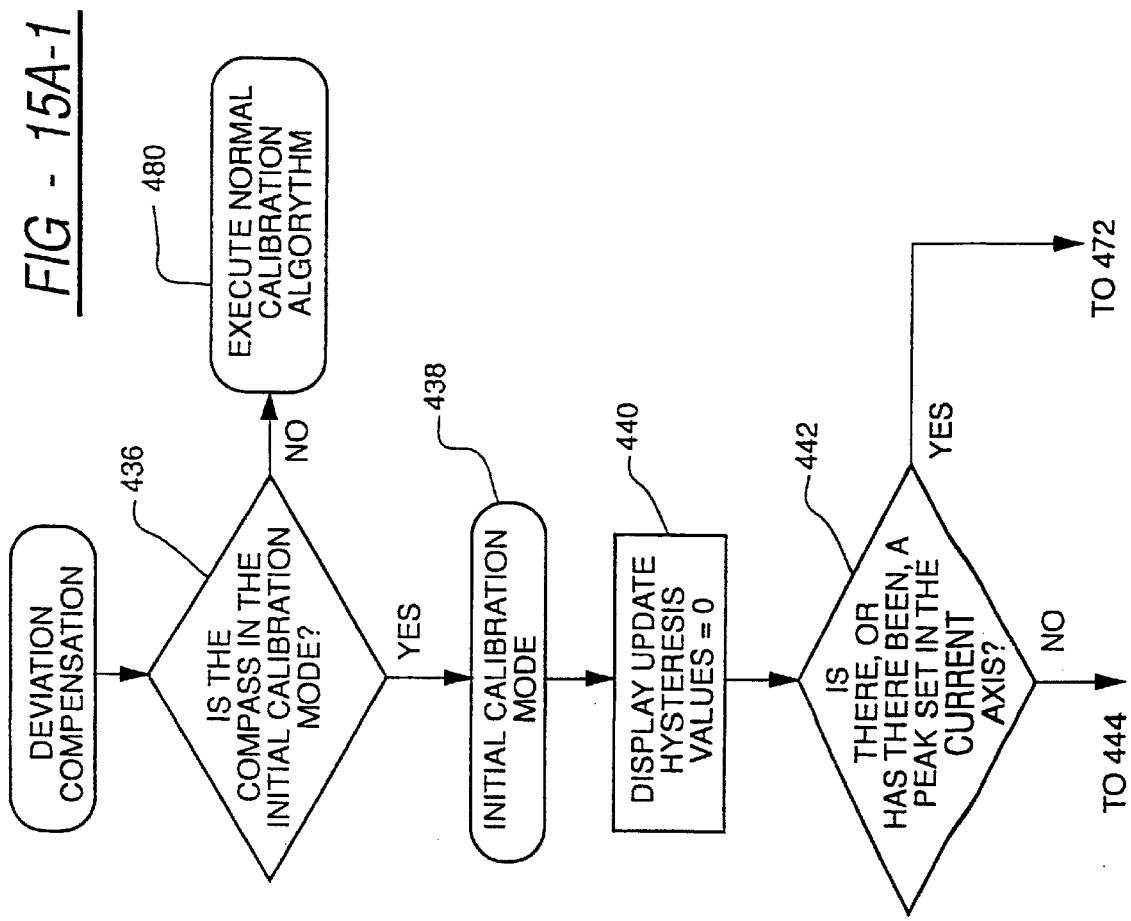
Figures 2, 15A:
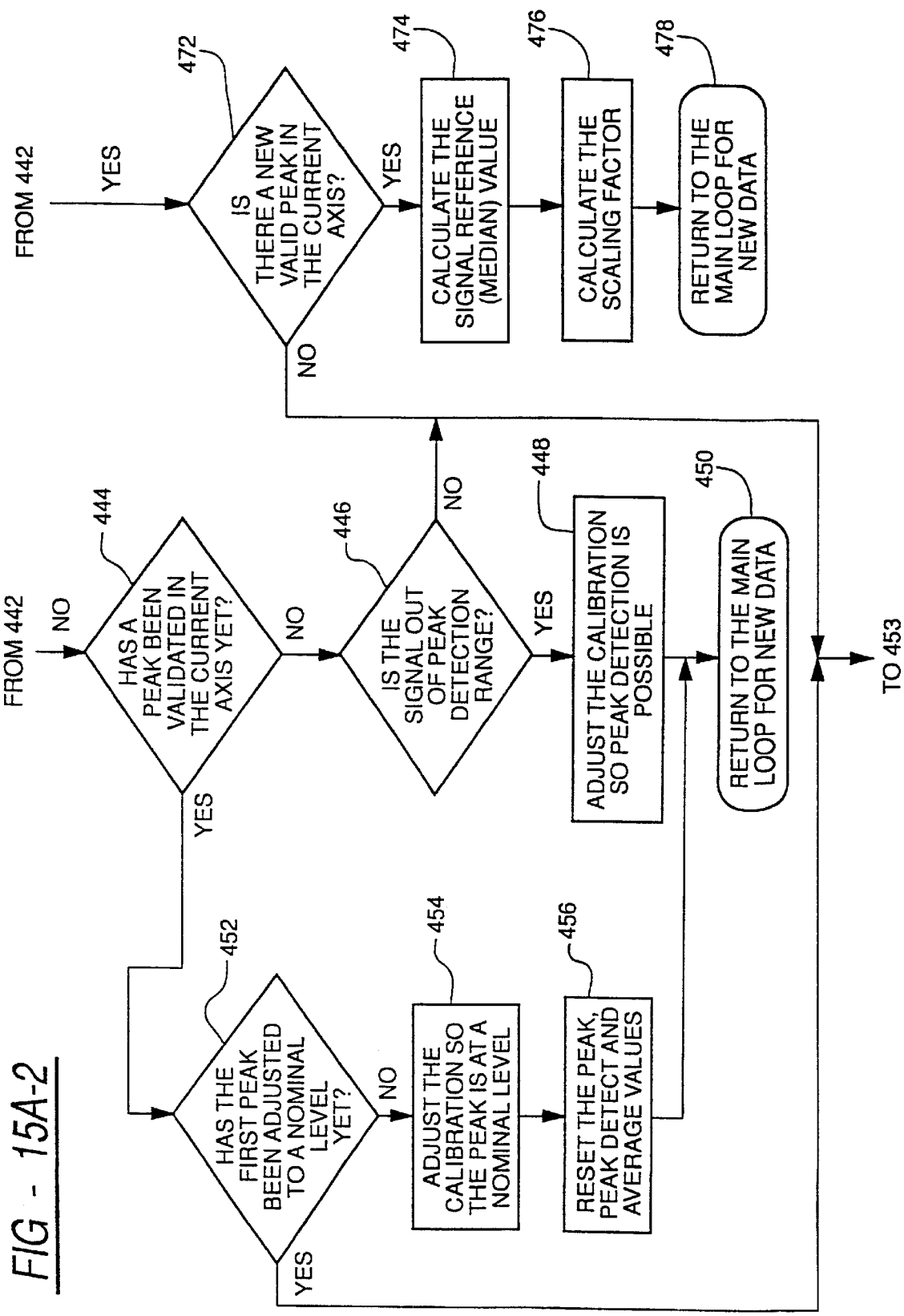
Figure 15B:
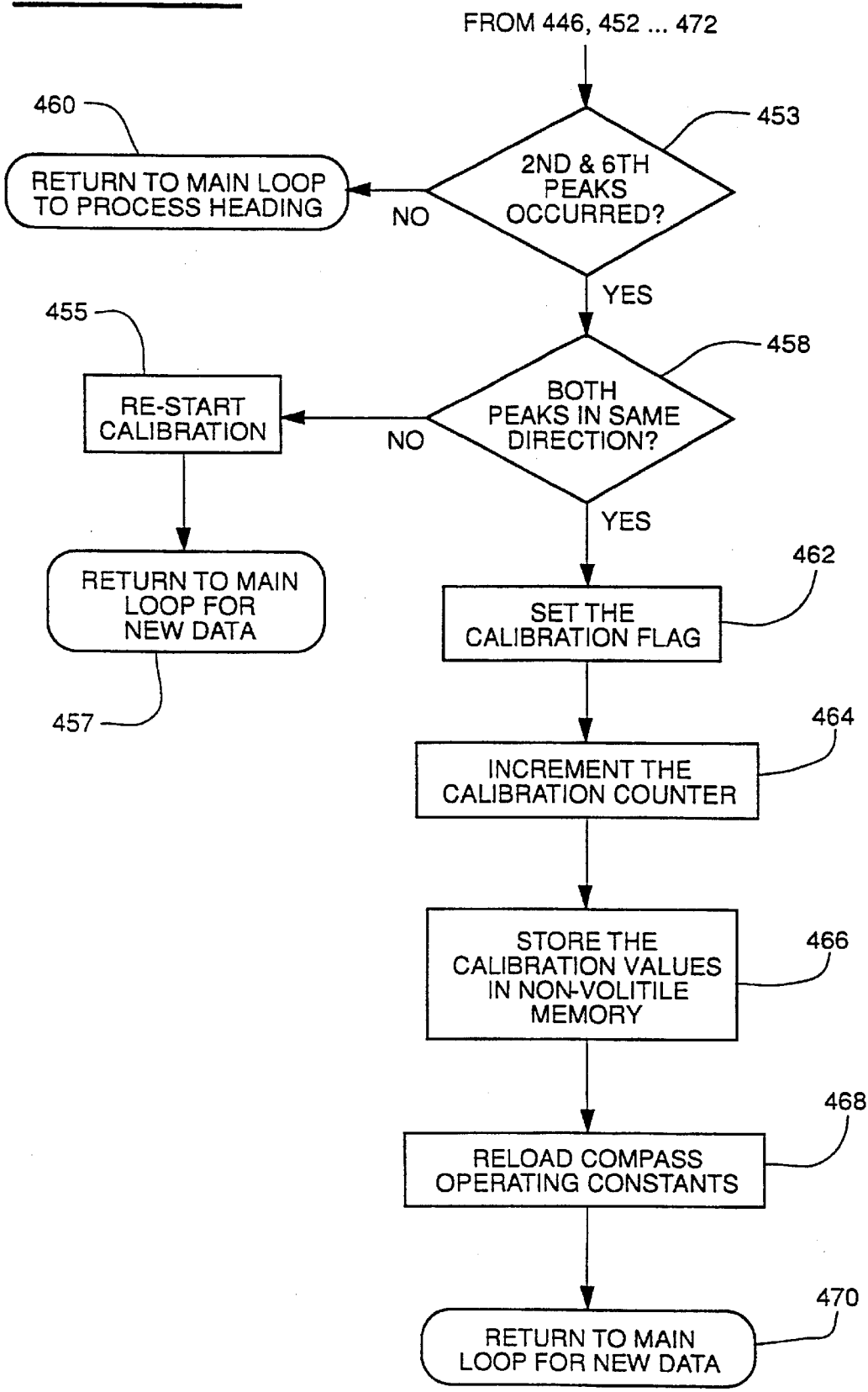

The operation of the system in the initial calibration mode will now be described with reference to FIGS. 15A and 15B. As discussed above, in the initial calibration mode, the sensor offset current is first changed as needed to produce readable sensor signals which are within a predetermined measurement range. The signal peak values are also adjusted to a nominal earth field level by changing the sensor offset current. The compensating signal reference values are then determined for each axis, as the peak set values are determined, for the respective axis.

To enter the initial calibration mode, the calibrate switch 82 is actuated by the operator by pressing and holding it closed for a predetermined time, for example, about a half second. This causes the display to display "CAL" to confirm to the operator that the compass is in the initial calibration mode. The operator may then calibrate the compass by driving the vehicle in approximately two circles. As the vehicle traverses such a course, it acquires peak (e.g. north) and peak set (e.g. north/south or east/west) values. The microcomputer 38' then determines the compensating signal reference value for each axis as each peak for that axis is determined. After the vehicle has been driven in two circles, the microcomputer will have counted six peaks (e.g. north or south) and, provided the second and sixth correspond directionally (e.g., north and south) it will then automatically exit the initial calibration mode and the "CAL" display is turned off.

The control program for performing deviation compensation (which is represented by the block 414 in FIG. 14A) will be described in more detail with reference to FIGS. 15A and 15B. The compensation routine starts with a test block 436 which determines whether the compass is in the initial calibration mode. If it is not, the program proceeds to operate in the normal calibration mode 480 which will be described subsequently with reference to FIG. 16. If the compass is in the initial calibration mode, the program advances to the routine for that mode indicated at block 438. First, block 440 sets the time delay value to zero for the compass display. This disables the time delay which is used in normal compass operation to dampen changes in the displayed direction when only a momentary change has occurred.

Then, the program advances to the test block 442 which determines whether a peak set has occurred in the current axis. (In this routine, the program is executed alternately for the X-axis and Y-axis signals. In the flow chart, the term "current" axis means the axis for which the program is being executed at the time.) If there has not been a peak set in the current axis, the program advances to a test block 444 which determines whether a peak has been validated in the current axis. If not, the test block 446 determines whether the signal is out of peak detection range. If it is, the microcomputer 38' adjusts the D/A converter 44' setting by eight counts to change the offset current in the current strap 18 so that the sensor signal is adjusted such that it is within the readable A/D range enough to permit peak detection. This is done at block 448. Then, the program returns to the main loop for new data.

If at block 444, it is determined that a peak has been validated in the current axis, the program branches to test block 452. This determines whether the first peak has been adjusted to the nominal earth field level. If it has not, the program advances to block 454 which adjusts the offset current for the sensor so that the peak is at a nominal level. (The nominal level, as stated above, is a signal corresponding to an earth field of about 200 mGauss.) Then, block 456 resets the peak, peak detect and average values and the program returns to the main loop for new data at block 450.

If it is determined at test block 452 that the first peak had been adjusted to a nominal level, the program advances to test block 453 for a determination of whether the second and sixth peaks have both occurred. If not, at block 460 the program returns to the main loop at block 416 to process the heading. If both peaks have occurred, test block 458 determines whether they correspond directionally. If not, block 455 re-starts initial calibration and the program returns at block 457 to the main loop for new data. If both peaks correspond directionally, the initial calibration exit criteria has been met and the calibration flag is set at block 462. Then, the calibration counter is incremented at block 464 to keep track of the number of times the compass has been calibrated. Next, the program advances to block 466 which stores the calibration values in the non-volatile memory. This includes the values on the D/A converter 44', the scaling factor, the compensating signal reference values, the peak values and the value of the register that stores the calibration flag. Then, the program advances to block 468 which reloads the compass operating constants. This step includes reloading the EEPROM and storing the calibration values in their respective storage locations including the calibration step-size (typically two counts) for normal calibration. Then, the program returns to the main loop for new data as indicated at block 470.

If at test block 442, it is determined that there has been a peak set in the current axis, the program advances to test block 472 which determines whether there is a new valid peak in the current axis. If the answer is no, the program proceeds to block 453 which was described above. If there is a new valid peak, the program advances to block 474 to determine the signal reference value by calculating the average of the peak set values. Then, the program advances to block 476 which calculates the scaling factor. The scaling factor is used to match the output of one of the X-axis and Y-axis sensors to the other and for this purpose, the signal from that axis which has the lower signal level is multiplied by the scaling factor to scale it to the sensor having the larger signal level. The scaling factor is calculated by dividing the peak value of the larger signal by the peak value of the lower signal. After block 476, the program returns to the main loop for new data as indicated at block 478.

Normal Compensation Mode

It is desirable to provide the compass with long term calibration after the initial calibration in order to compensate for any changes that may occur on a long term basis in the ambient magnetic field. For this purpose, normal calibration is automatically performed whenever the compass is operated in its direction indicating mode. The compass operates in this mode at any time that the ignition switch is on and the initial calibration mode is not operative. In general, in the normal calibration mode, the X-axis and Y-axis sensor signals are sampled and stored. Whenever a new peak is acquired for one axis, which should occur at the signal reference value in the orthogonal axis, an adjustment value is stored and later used to adjust the compensating signal reference value. This is accomplished by adding the stored signal reference adjustment to the existing signal reference value. During normal compensation, the compensating signal reference values for each axis may be adjusted once, and preferably, twice, once for each new peak in the opposite axis during each ignition or power-up cycle of compass operation. Suitably, this compensation is effected upon the occurrence of the first peak in each of the X-axis and Y-axis after a warm-up delay as described below.

Figure 16:
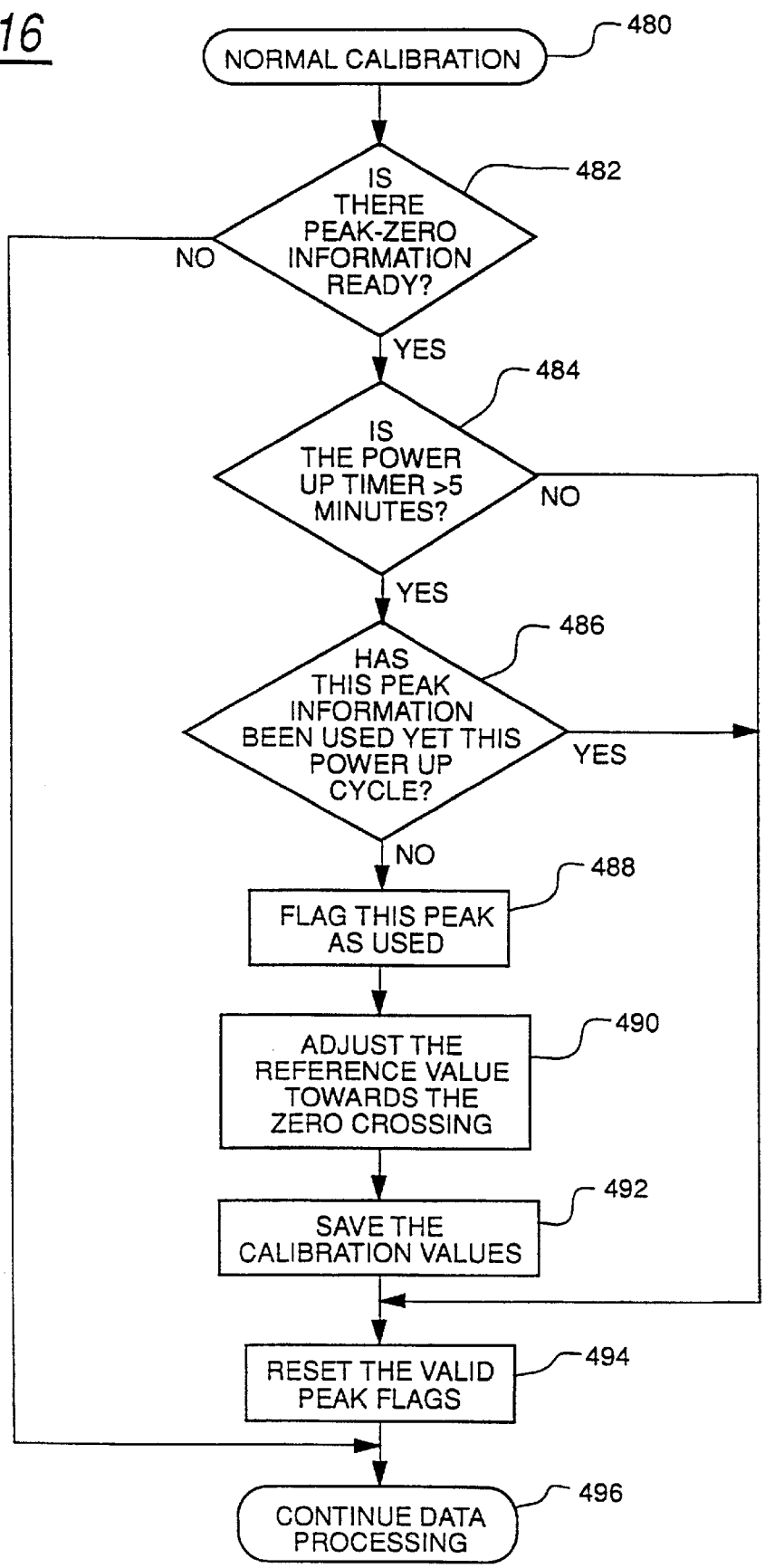
FIG. 16 is a flow chart representing the program executed by the microcomputer for the normal calibration mode of operation.

The operation in the normal calibration mode will be further described with reference to the flow chart of FIG. 16. The normal calibration mode is entered at block 480 and the test block 482 determines whether the peak and signal reference adjustment information is ready. If not, the program continues processing the data signals as indicated at block 496. If peak and signal reference adjustment information is ready, the program advances to block 484 which determines whether the power-up timer of the microcomputer 38' is greater than five minutes which has the effect of delaying normal calibration for a period of five minutes after the ignition switch is turned on. If the answer at block 484 is no, the program advances to block 494 which resets the valid peak flags and then the program continues data processing. If the timer is greater than five minutes, the program advances to test block 486 which determines whether the peak information that has been acquired has been used already in this power-up cycle. If it has, the program advances to reset the valid peak flags at block 494 and data processing is continued. If the peak information has not yet been used, the program advances to block 488 which sets a flag to indicate that this peak has been used in this power-up cycle. Then, at block 490, the signal reference adjustment value is added to the compensating signal reference value. For example, in the case of an X-axis peak, if the Y-axis measured signal at the time of the X-axis peak is not equal to the Y-axis signal reference value, the signal reference value is adjusted by two counts towards the Y-axis measured value. Then, the program advances to block 492 which stores the compensating signal reference values, i.e. the new reference value for each of the axes. In block 494, the valid peak flags are reset and the program then continues data processing as indicated in block 496.

Sensor Offset Calculation

Each of the X-axis and Y-axis sensors may have a signal offset voltage which is inherent in the system which, without proper correction may result in inaccurate or unusable sensor signals. The sensor offset voltage may arise in part from the internal characteristics of the particular sensor. Further, the sensor offset voltage may be induced, in part, from the signal path externally of the sensor and from software latency. The sensor offset voltage is independent of the offset arising from the vehicle magnetic field previously discussed.

Figure 17:
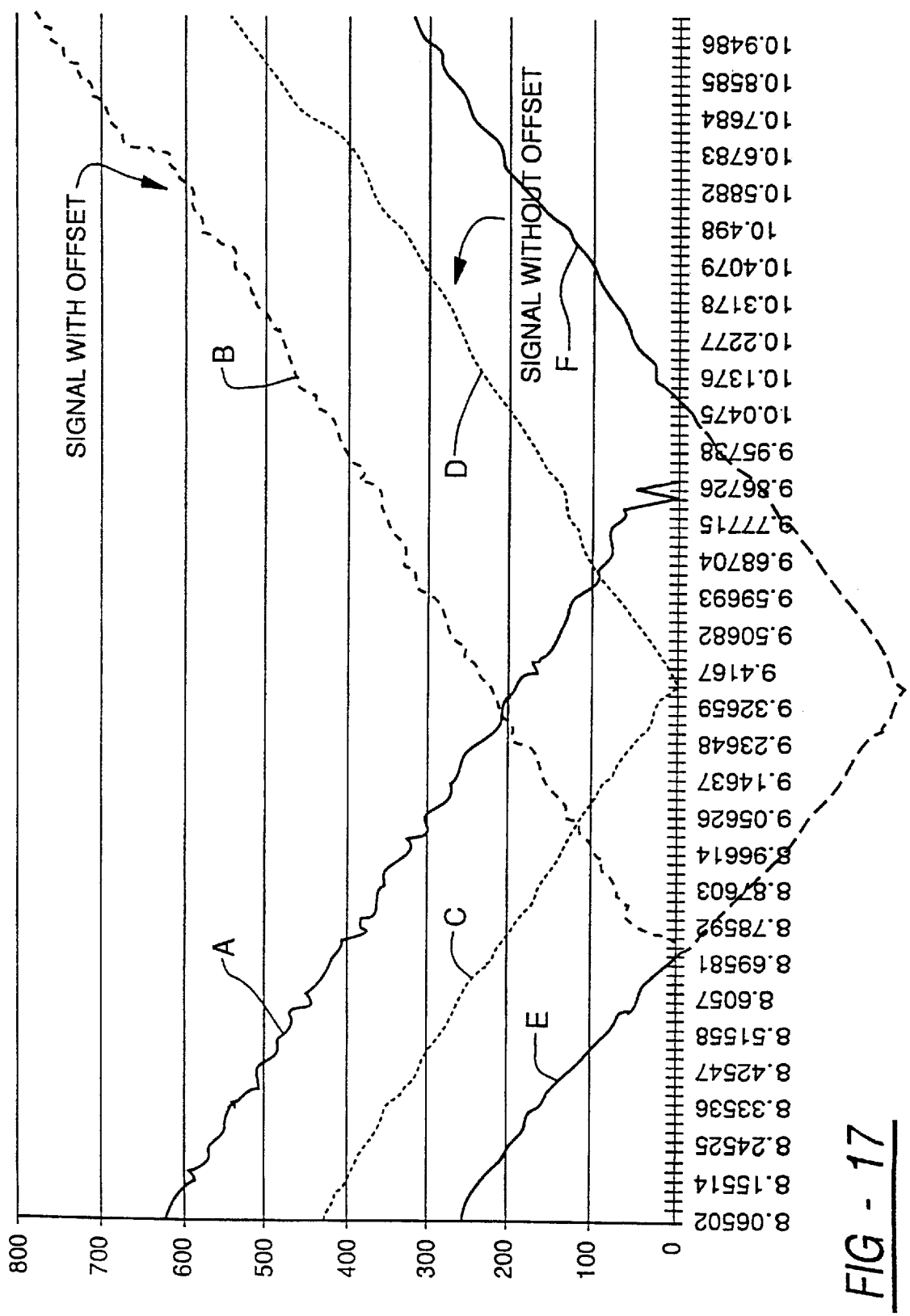
FIG. 17 is a graph showing examples of sensor offset.

Examples of sensor offset voltage are illustrated in FIG. 17. FIG. 17 is a graphical representation of the signal voltage of the Y-axis sensor as a function of time as it is developed at the output of the A/D converter 42'. Lines C and D represent a signal with no offset. The line C represents the signal voltage developed during the reset mode and the line D represents the signal voltage developed during the set mode. Line C, being from the reset mode, is indicative of the magnetic south component and line D, being from the set mode, is indicative of the magnetic north component. Lines C and D intersect at the reference value of the signal voltage which indicates the heading of east or west.

A signal with zero sensor offset voltage indicates a definite direction without ambiguity. The sensor does not have an output signal in both set and reset modes at the same time. There are certain conditions of sensor offset voltage in which the signals, during reset and set modes are of such values that accurate direction information may not be derived from them. One example of this condition is represented by a reset voltage corresponding to line E and a set voltage corresponding to line F. In this condition, the Y-axis sensor has a zero output voltage in both sensor modes. In the time interval between the zero values, no direction information can be derived. Another example is a condition in which the sensor has a positive signal in both sensor modes at the same time. This is represented by reset voltage shown by line A and a set voltage shown by line B. In order to remove such offset conditions, an offset voltage calibration value is calculated and added to the sensor signal to compensate for the offset. This offset calibration value is calculated as one-fourth the sum of the set data and reset data plus one-half of the previously calculated offset value.

The sensor offset voltage calculation routine is imbedded in the retrieve data block 404 of FIG. 14A. This routine 404' entitled "SENSOR OFFSET VOLTAGE CALIBRATION" is represented by the flow chart of FIG. 18. In this program, the set and reset mode data is retrieved from the current axis at block 510. Then, at test block 512, it is determined whether both the set and reset data are greater than zero at the same time or whether they are equal to zero at the same time. If they are not, the program continues data processing as indicated at block 516. If they are in block 514, the sensor offset calibration value is calculated by adding one-fourth of the set data plus the reset data to one-half of the old calibration offset value.

As described, the sensor offset calibration value for each X-axis and Y-axis is used to compensate for the sensor offset in the program step indicated at block 404. Accordingly, the signal data which is processed downstream of that block is corrected for sensor offset.

Compass And Vehicle Mirror Combination

According to this invention, the electronic compass is incorporated, in whole or in part, into the structure of a vehicle inside rearview mirror. In this application, the sensor board 36 (see FIG. 4) may be mounted on the inside rearview mirror assembly so that its position is fixed with respect to the vehicle or at a suitable remote location in the vehicle. The compass display 76' may be located in the mirror structure for convenient viewing by the vehicle driver. Several different arrangements will be described below.

Figure 19:
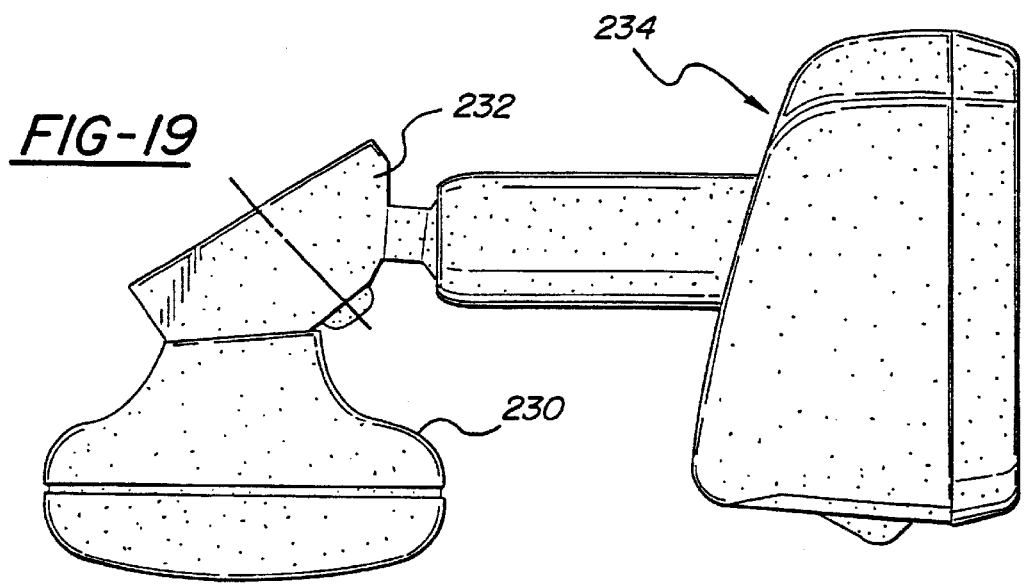
FIG. 19 is a side elevation view of a vehicle inside the rearview mirror having the compass of this invention installed therein.

As shown in FIG. 19, the compass circuit of FIGS. 12A and 12B is located in a compass module 230 secured below the mounting bracket 232 of the rearview mirror 234.

Figure 20:
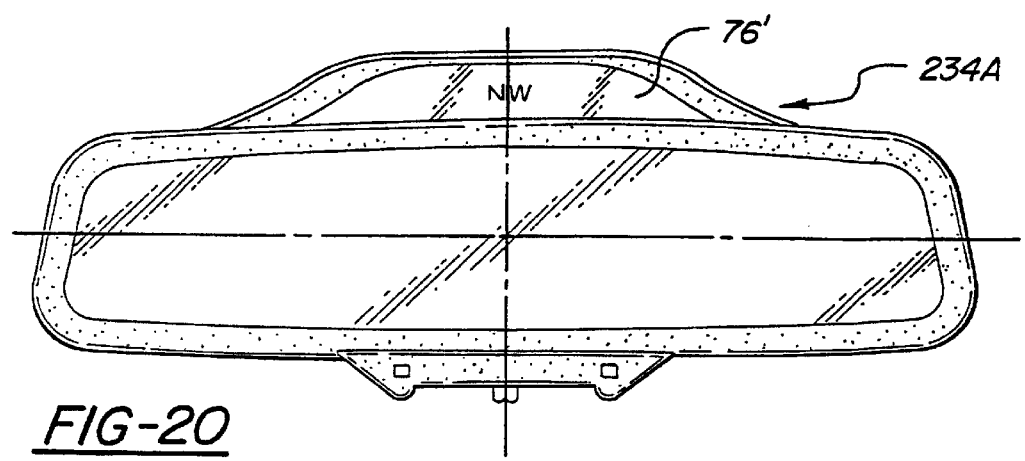
FIG. 20 is a front elevation view of an inside rearview mirror showing a compass display above the mirror.
Figure 21:
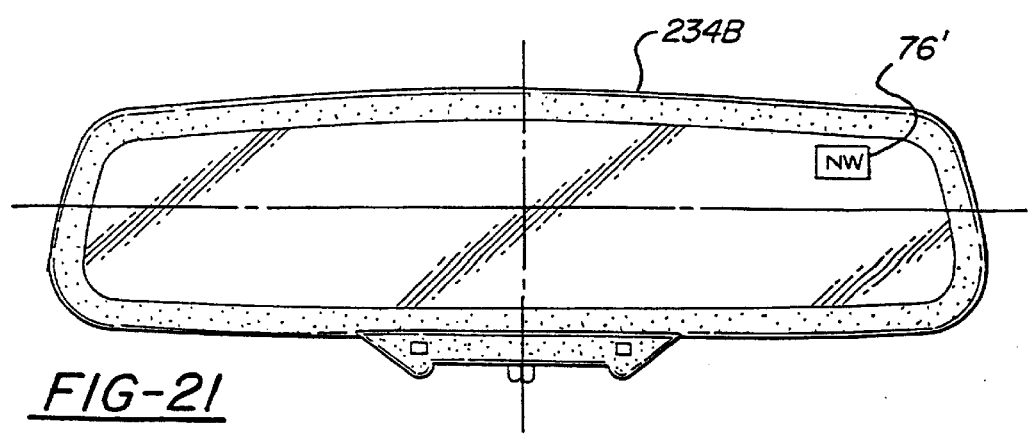
FIG. 21 is a front elevation view of another inside rearview mirror with the compass display behind the mirror.

As shown, in FIG. 20, the module may communicate with a prismatic mirror or electrochromic mirror so that the vehicle heading may be displayed above the mirror. Alternatively, as shown in FIG. 21, the display 76' may be located behind the mirror and viewable through a transparent area by all passengers in the vehicle.

Figure 22A:
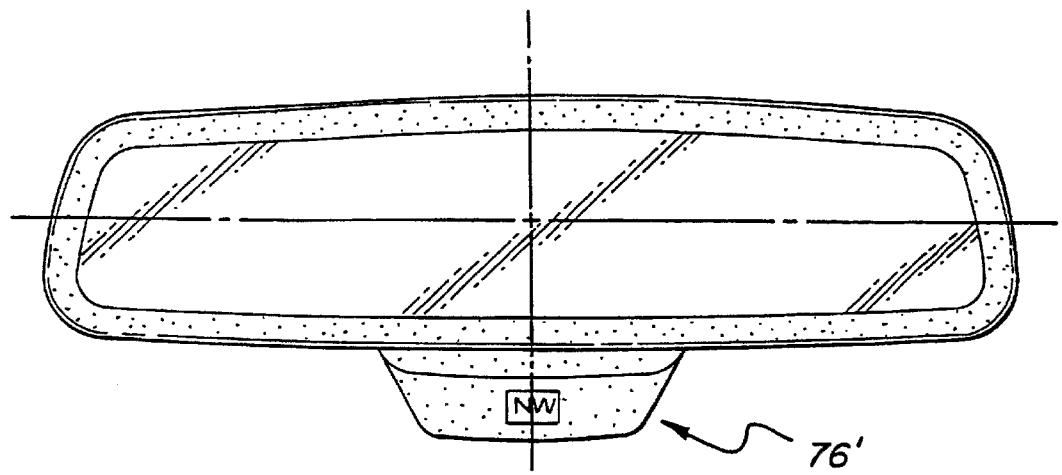
FIG. 22A is a front elevation view of an inside rearview mirror with an integrated compass module mounted on the mirror support bracket.
Figure 22B:
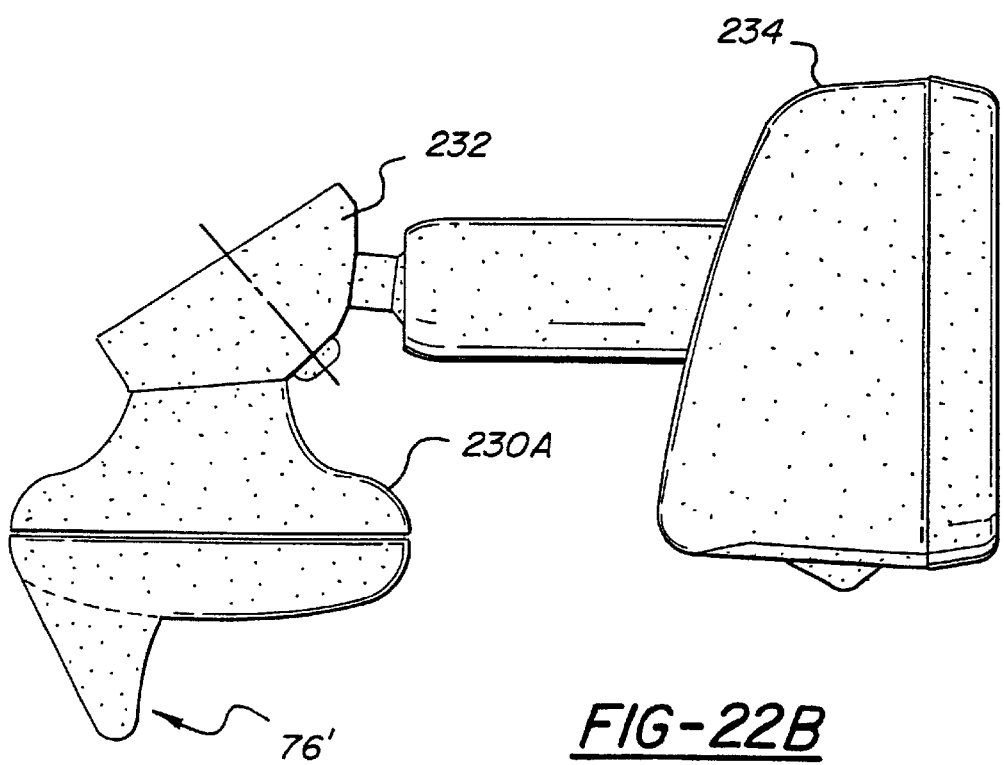
FIG. 22B is side elevation view of the mirror and compass of FIG. 22A.

FIGS. 22A and 22B depict an integrated compass module. In this arrangement, the compass module 230A houses the electronic circuit of the compass (either that of FIGS. 12A and 12B or that of FIG. 13) and also the display. This module is supported on the mirror mounting bracket 232 such that the display 76' is viewable below the mirror 234.

A stand alone compass module may be mounted similarly and supply directional information to other vehicle systems for display or navigational purposes.

CONCLUSION

Although the description of this invention has been given with reference to particular embodiments, it is not to be construed in a limiting sense. Many variations and modifications will now occur to those skilled in the art. For a definition of the invention, reference is made to the appended claims.

What is claimed is:

1. A compensated electronic compass system suitable for use in a vehicle comprising:

an inside rearview mirror assembly, said assembly including a mirror mounting bracket for mounting said assembly in the vehicle;

a two-axis compass sensor comprising a first magnetoresistive sensor and a second magnetoresistive sensor for detecting an external magnetic field and developing electronic signals representative of the strength and direction of said magnetic field, said external magnetic field being a combination of the earth magnetic field and a deviating magnetic field of the vehicle;

each of said first and second sensors comprising at least one magnetoresistive field sensing element having a magnetic field sensitive axis and having an output which provides an output signal representative of a component of said external magnetic field along said sensitive axis, said first and second sensors being orientated with their sensitive axes in a predetermined angular relation with each other;

a digital electronic circuit including a microcomputer coupled with said output of said first sensor and said output of said second sensor;

said compass system providing a direction indicating signal to a compass heading display located within the vehicle, said direction indicating signal compensated for the deviating magnetic field of the vehicle so as to be representative of the magnetic heading of the vehicle;

said compass system having an initial calibration mode to determine an initial deviation compensation for a particular vehicle installation and a normal calibration mode which is operative during normal compass operation; said compass system automatically exiting said initial calibration mode into said normal calibration mode after said initial deviation compensation is complete;

wherein said two-axis compass sensor and said digital electronic circuit are located in a module that is secured to said mounting bracket of said inside rearview mirror assembly, wherein said compass heading display is mounted to said inside rear view mirror assembly and wherein said module communicates with said display, and wherein said magnetic field sensitive axis of said first magnetoresistive sensor is orientated orthogonal to said magnetic field sensitive axis of said second magnetoresistive sensor and wherein said magnetic field sensitive axis of said first magnetoresistive sensor is orientated parallel to the longitudinal axis of the vehicle when said two-axis compass sensor is mounted in the vehicle.

2. The compass system of claim 1 wherein said compass system exits said initial calibration mode into said normal calibration mode after a plurality of cardinal compass points is sensed by said two-axis sensor.

3. The compass system of claim 2 wherein said plurality of cardinal points is at least six cardinal points.

4. The compass system of claim 1 wherein said compass system is provided with a manual actuation to set said system into said initial calibration mode.

5. The compass system of claim 1 wherein said manual actuation comprises manual closure of a switch for a predetermined time.

6. The compass system of claim 5 wherein said predetermined time is about a half second.

7. The compass system of claim 1 wherein said direction indicating signal is automatically compensated for any change in said deviating field of said vehicle at least once during each ignition cycle of the vehicle when said compass system is in said normal calibration mode.

8. The compass system of claim 7 wherein said direction indicating signal is automatically compensated for any change in said deviating field of said vehicle at least twice during each ignition cycle of the vehicle when said compass system is in said normal calibration mode.

9. The compass system of claim 7 wherein said compass system includes a warm-up delay whereby compensation of said compass system while in said normal calibration mode is delayed for a period after the ignition switch of the vehicle is turned on.

10. The compass system of claim 9 wherein said warm-up delay period is at least five minutes.

11. The compass system of claim 1 wherein said microcomputer operates under a control program that computes the magnetic heading of the vehicle.

12. The compass system of claim 1 wherein said magnetoresistive field sensing elements are deposited as thin films on a substrate.

13. The compass system of claim 12 wherein said substrate comprises a silicon substrate.

14. The compass system of claim 13 wherein said thin films comprise a ferromagnetic material.

15. The compass system of claim 1 wherein said compass heading display comprises an alphanumeric display.

16. The compass system of claim 15 wherein said alphanumeric display comprises a vacuum fluorescent display.

17. The compass system of claim 1 wherein said two-axis compass sensor is mounted so that its position is fixed with respect to the vehicle.

18. The compass system of claim 1 wherein said inside mirror assembly includes a mirror and wherein said compass heading display is located behind the mirror of said inside rearview mirror assembly and viewable through an area thereof.

19. The compass system of claim 1 wherein said inside mirror assembly includes a mirror and wherein said compass heading display is displayed above the mirror of said inside rearview mirror assembly.

20. The compass system of claim 1 wherein said inside mirror assembly includes a mirror and wherein said compass heading display is displayed below the mirror of said inside rearview mirror assembly.

21. The compass system of claim 1 wherein said inside rearview mirror assembly comprises a prismatic mirror.

22. The compass system of claim 1 wherein said inside rearview mirror assembly comprises an electrochromic mirror.

23. A compensated electronic compass system suitable for use in a vehicle comprising:

an inside rearview mirror assembly, said assembly including a mirror mounting bracket for mounting said assembly in the vehicle;

a two-axis compass sensor comprising a first magnetoresistive sensor and a second magnetoresistive sensor for detecting an external magnetic field and developing electronic signals representative of the strength and direction of said magnetic field, said external magnetic field being a combination of the earth magnetic field and a deviating magnetic field of the vehicle;

each of said first and second sensors comprising at least one magnetoresistive field sensing element having a magnetic field sensitive axis and having an output which provides an output signal representative of a component of said external magnetic field along said sensitive axis, said first and second sensors being orientated with their sensitive axes in a predetermined angular relation with each other;

a digital electronic circuit including a microcomputer coupled with said output of said first sensor and said output of said second sensor;

said compass system providing a direction indicating signal to a compass heading display located within the vehicle, said direction indicating signal compensated for the deviating magnetic field of the vehicle so as to be representative of the magnetic heading of the vehicle;

said compass system having an initial calibration mode to determine an initial deviation compensation for a particular vehicle installation and a normal calibration mode which is operative during normal compass operation;

said compass system automatically exiting said initial calibration mode into said normal calibration mode after said initial deviation compensation is complete;

wherein said two-axis compass sensor and said digital electronic circuit are located in a module that is secured to said mounting bracket of said inside rearview mirror assembly, and wherein said magnetic field sensitive axis of said first magnetoresistive sensor is orientated orthogonal to said magnetic field sensitive axis of said second magnetoresistive sensor and wherein said magnetic field sensitive axis of said first magnetoresistive sensor is orientated parallel to the longitudinal axis of the vehicle when said two-axis compass sensor is mounted in the vehicle.

24. The compass system of claim 23 wherein said compass system exits said initial calibration mode into said normal calibration mode after a plurality of cardinal compass points is sensed by said two-axis sensor.

25. The compass system of claim 24 wherein said plurality of cardinal points is at least six cardinal points.

26. The compass system of claim 23 wherein said compass system is provided with a manual actuation to set said system into said initial calibration mode.

27. The compass system of claim 23 wherein said manual actuation comprises manual closure of a switch for a predetermined time.

28. The compass system of claim 27 wherein said predetermined time is about a half second.

29. The compass system of claim 23 wherein said direction indicating signal is automatically compensated for any change in said deviating field of said vehicle at least once during each ignition cycle of the vehicle when said compass system is in said normal calibration mode.

30. The compass system of claim 29 wherein said direction indicating signal is automatically compensated for any change in said deviating field of said vehicle at least twice during each ignition cycle of the vehicle when said compass system is in said normal calibration mode.

31. The compass system of claim 29 wherein said compass system includes a warm-up delay whereby compensation of said compass system while in said normal calibration mode is delayed for a period after the ignition switch of the vehicle is turned on.

32. The compass system of claim 31 wherein said warm-up delay period is at least five minutes.

33. The compass system of claim 23 wherein said microcomputer operates under a control program that computes the magnetic heading of the vehicle.

34. The compass system of claim 23 wherein said magnetoresistive field sensing elements are deposited as thin films on a substrate.

35. The compass system of claim 34 wherein said substrate comprises a silicon substrate.

36. The compass system of claim 35 wherein said thin films comprise a ferromagnetic material.

37. The compass system of claim 23 wherein said compass heading display comprises an alphanumeric display.

38. The compass system of claim 37 wherein said alphanumeric display comprises a vacuum fluorescent display.

39. The compass system of claim 23 wherein said two-axis compass sensor is mounted so that its position is fixed with respect to the vehicle.

40. The compass system of claim 23 wherein said inside mirror assembly includes a mirror and wherein said compass heading display is located behind the mirror of said inside rearview mirror assembly and viewable through an area thereof.

41. The compass system of claim 23 wherein said inside mirror assembly includes a mirror and wherein said compass heading display is displayed above the mirror of said inside rearview mirror assembly.

42. The compass system of claim 23 wherein said inside mirror assembly includes a mirror and wherein said compass heading display is displayed below the mirror of said inside rearview mirror assembly.

43. The compass system of claim 23 wherein said inside rearview mirror assembly comprises a prismatic mirror.

44. The compass system of claim 23 wherein said inside rearview mirror assembly comprises an electrochromic mirror.

45. The compass system of claim 23 wherein said module communicates with a compass heading display located on said inside mirror assembly.

46. The compass system of claim 23 wherein said compass heading display is displayed at a position in the vehicle remote from the location of the inside rearview mirror assembly.

* * * * *